(12) United States Patent
Liu

(10) Patent No.: US 11,532,775 B2
(45) Date of Patent: Dec. 20, 2022

(54) DISPLAY PANEL AND MANUFACTURING METHOD THEREOF

(71) Applicant: Au Optronics Corporation, Hsinchu (TW)

(72) Inventor: Chung-Chan Liu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 152 days.

(21) Appl. No.: 16/987,374

(22) Filed: Aug. 6, 2020

(65) Prior Publication Data
US 2021/0242379 A1 Aug. 5, 2021

(30) Foreign Application Priority Data
Jan. 30, 2020 (TW) .................................. 109102754

(51) Int. Cl.
*H01L 33/62* (2010.01)
*H01L 27/15* (2006.01)
*H01L 33/00* (2010.01)
*H01L 33/48* (2010.01)
*G09G 3/32* (2016.01)

(52) U.S. Cl.
CPC ............... *H01L 33/62* (2013.01); *G09G 3/32* (2013.01); *H01L 27/156* (2013.01); *H01L 33/005* (2013.01); *H01L 33/486* (2013.01); H01L 2933/0066 (2013.01)

(58) Field of Classification Search
CPC ..... H01L 33/62; H01L 27/156; H01L 33/005; H01L 33/486; H01L 2933/0066; H01L 25/0753; H01L 25/167; G09F 9/33; G09F 3/32
See application file for complete search history.

(56) References Cited

U.S. PATENT DOCUMENTS

| | | | |
|---|---|---|---|
| 10,726,773 B2 | 7/2020 | Xi | |
| 2016/0351092 A1* | 12/2016 | Chen | G09G 3/3233 |
| 2018/0159088 A1* | 6/2018 | Lai | H01L 22/22 |
| 2019/0157248 A1* | 5/2019 | Lee | H01L 25/0753 |
| 2019/0157340 A1* | 5/2019 | Liao | H01L 27/156 |
| 2019/0172761 A1* | 6/2019 | Guo | H01L 22/22 |
| 2020/0168585 A1 | 5/2020 | Lo et al. | |
| 2020/0235128 A1* | 7/2020 | Shin | H01L 21/76894 |
| 2020/0381600 A1* | 12/2020 | Liu | H01L 33/54 |
| 2020/0388601 A1* | 12/2020 | Liu | H01L 25/167 |

(Continued)

FOREIGN PATENT DOCUMENTS

| | | |
|---|---|---|
| TW | I679756 | 12/2019 |
| TW | I683431 | 1/2020 |

*Primary Examiner* — Victor A Mandala
(74) *Attorney, Agent, or Firm* — JCIPRNET

(57) ABSTRACT

A display panel including an array substrate, a first sub-pixel, a second sub-pixel, and a first light-emitting diode is provided. The array substrate includes a first connection pad and a second connection pad. The first sub-pixel includes a first driving unit electrically connected to the first connection pad. The second sub-pixel includes a second driving unit electrically connected to the second connection pad. The first light-emitting diode completely overlaps and is physically isolated from the second connection pad. The first light-emitting diode is not completely overlapped and is electrically connected to the first connection pad. A manufacturing method of a display panel is also provided.

9 Claims, 27 Drawing Sheets

(56) References Cited

U.S. PATENT DOCUMENTS

2021/0202604 A1\* 7/2021 Wu ......................... G09G 3/32
2021/0225817 A1\* 7/2021 Liao ................... H01L 25/0753
2022/0199605 A1\* 6/2022 Chaji ................. H01L 33/0095

\* cited by examiner

DISPLAY PANEL AND MANUFACTURING METHOD THEREOF

CROSS-REFERENCE TO RELATED APPLICATION

This application claims the priority benefit of Taiwan application no. 109102754, filed on Jan. 30, 2020. The entirety of the above-mentioned patent application is hereby incorporated by reference herein and made a part of this specification.

BACKGROUND

Field of the Disclosure

The disclosure relates to a panel and a manufacturing method thereof, and particularly to a display panel and a manufacturing method thereof.

Description of Related Art

Light emitting diodes (LEDs) have advantages such as long service life, small size, high shock resistance, low value of heat generation, and low power consumption. Therefore, LEDs have been commonly used as indicators or light source for household appliances and various devices. In recent years, LEDs have been developed to have multiple colors and high illuminance, and thus the application thereof has been expanded to large outdoor signage, traffic signal lights and related fields. Accordingly, LEDs are often used as the main illuminating source with both power saving and environmental protection functions.

However, if the LEDs of a display panel are damaged, malfunctioned, or have low performance, the display quality is often degraded. Therefore, how to improve the display quality of the display panel has become an urgent problem to be solved at the present stage.

SUMMARY OF THE DISCLOSURE

The disclosure provides a display panel and a manufacturing method thereof, which can make the display panel have a better display quality.

A display panel of the disclosure includes an array substrate, a first sub-pixel, a second sub-pixel, and a first light-emitting diode. The array substrate includes a first connection pad and a second connection pad. The first sub-pixel includes a first driving unit electrically connected to the first connection pad. The second sub-pixel includes a second driving unit electrically connected to the second connection pad. The first light-emitting diode completely overlaps and is physically isolated from the second connection pad. The first light-emitting diode is not completely overlapped and is electrically connected to the first connection pad.

The disclosure provides a manufacturing method of a display panel, which includes the following steps. An array substrate is provided, which includes a first connection pad and a second connection pad. The first light-emitting diode is arranged on the array substrate, and the first light-emitting diode completely overlaps the first connection pad and does not completely overlap the second connection pad. The first light-emitting diode is electrically connected to the second connection pad.

Based on the above, through the layout design, configuration method or repair method described above, the damaged, malfunctioned or low-efficiency light-emitting diodes can be repaired and thus the display panel can have a better display quality.

DESCRIPTION OF EMBODIMENTS

Figure 1A:
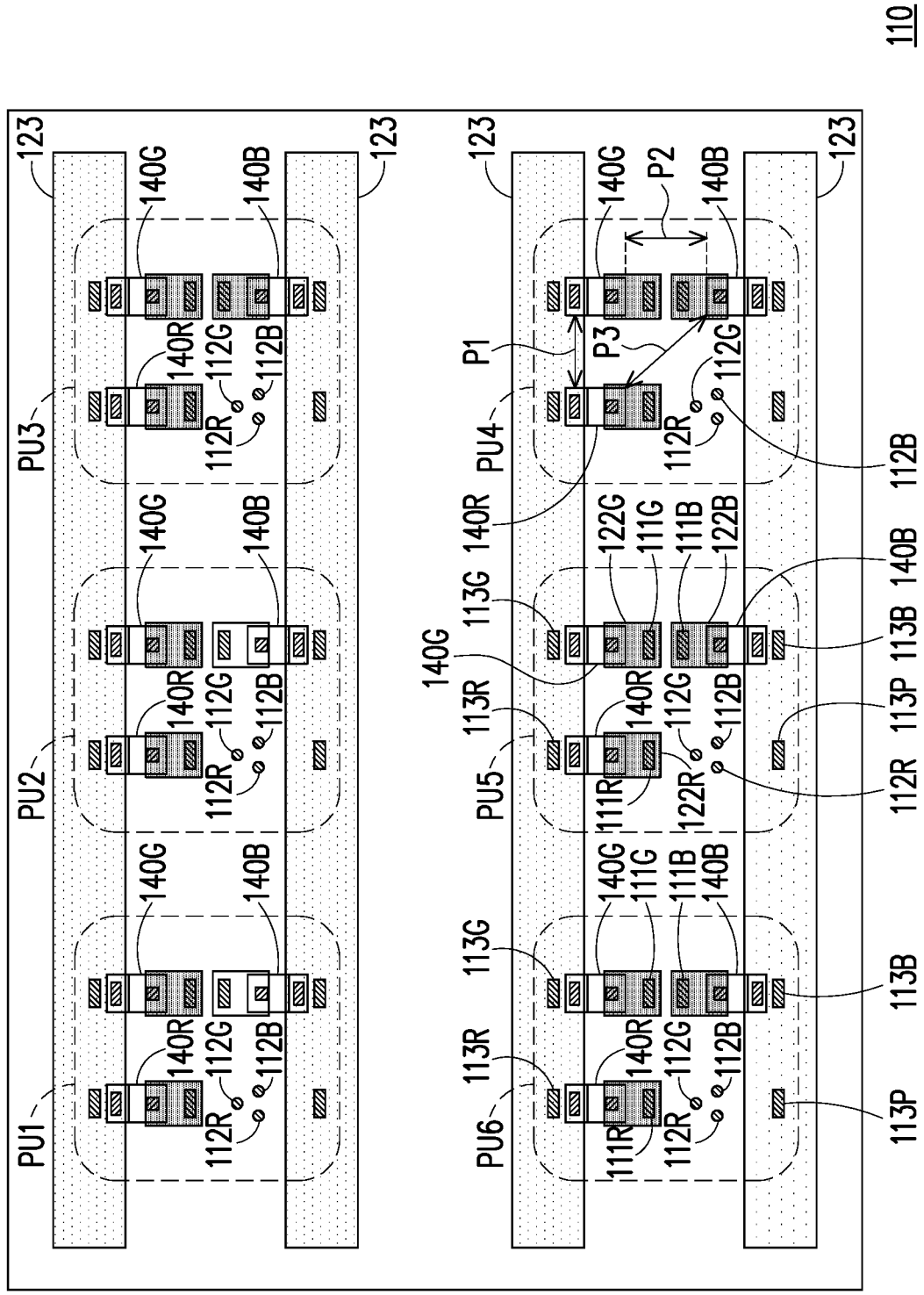
FIG. 1A and FIG. 1B are partial schematic top views of a partial manufacturing method for a display panel according to the first embodiment of the disclosure.

In order to make the aforementioned features and advantages of the disclosure more comprehensible, embodiments accompanying figures are described in detail below. The described embodiments may be modified in various different ways, without departing from the spirit or scope of the disclosure.

In the accompanying drawings, thicknesses of devices and so on are exaggerated for clarity. Throughout the specification, the same reference numerals in the accompanying drawings denote the same devices. It should be understood that when an element such as a layer, film, region or substrate is referred to as being "on another element," "connected to another element," or "overlapped to another element," it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected.

In the drawings, the same or similar reference numbers indicate the same or similar elements, and descriptions in this regard will be repeated in the following paragraph.

It should be understood that the terms "first," "second," and "third" may be used to describe different elements, components, regions, layers and/or portions in the disclosure, but these elements, components, regions, layers and/or portions should not be limited by these terms. These terms are only used to distinguish an element, component, region, layer and/or portion to another element, component, region, layer and/or portion. For instance, a first element, component, region, layer and/or portion may be referred to as a second element, component, region, layer and/or portion; similarly, a second element, component, region, layer and/or portion may be referred to as a first element, component, region, layer and/or portion without departing from the scope of the inventive concept.

The term used herein is for the purpose of describing particular embodiments and is not particularly limited. The articles "a," "an," and "the" are intended to include the plural forms as well to mean "at least one", unless the context clearly indicates otherwise. The articles "or" is intended to "and/or". As used herein, the term "and/or" includes any one and any combination of any two or more of the associated listed items. It is also to be understood that the terms "comprises," "includes," and "has" specify the presence of stated features, regions, steps, operations, elements, components, and/or combinations thereof, but the existence or addition of one or more other features, regions, steps, operations, elements, components, and/or combinations thereof are not excluded.

Further, relative terms such as "lower" or "bottom" and "upper" or "top" may be used herein for ease of description to describe one element's relationship to another element as shown in the figures. It will be understood that relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. Similarly, if the device in the figures is turned over, an element described as being "below" or "lower" relative to another element will then be "above" or "upper" relative to the other element. Thus, the term "below" encompasses both the below and above orientations depending on the spatial orientation of the device.

The term "about," "approximately," "similar," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system) or the limitations of the manufacturing system. For instance, "about" may mean within one or more standard deviations, or within, for example, ±30%, ±20%, ±10%, or ±5% of the stated value.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

The IEEE, IEC, GB/T (Guobiao), JIS (Japanese Industrial Standards), and/or CNS (Chinese National Standards) standards are used as much as possible in the schematic views illustrating circuit connections. Certainly, there are several standards for circuitry symbols, which may vary from region to region, and some are slightly different, but those having ordinary skill in the pertinent art should understand the meaning.

Exemplary embodiments are described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. That is, the regions shown in the drawings are schematic in nature, and their shapes are not intended to show the exact shape of the regions, and are not intended to limit the scope of the claims.

Figure 1B:
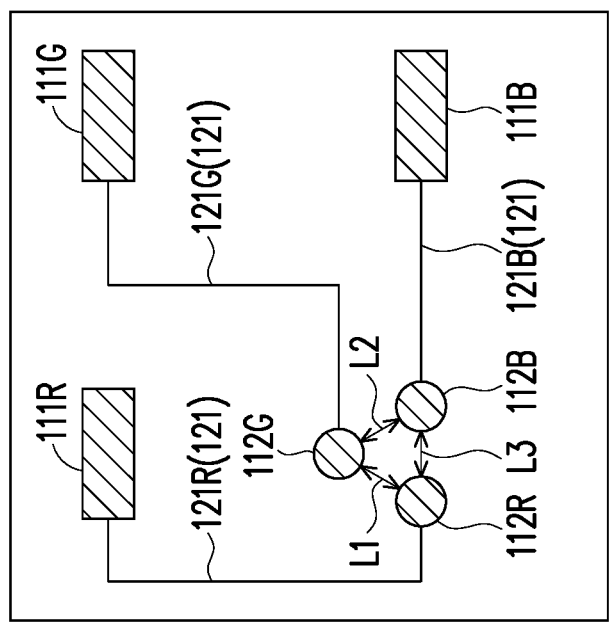
Figure 1B:
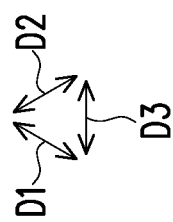
Figure 1C:
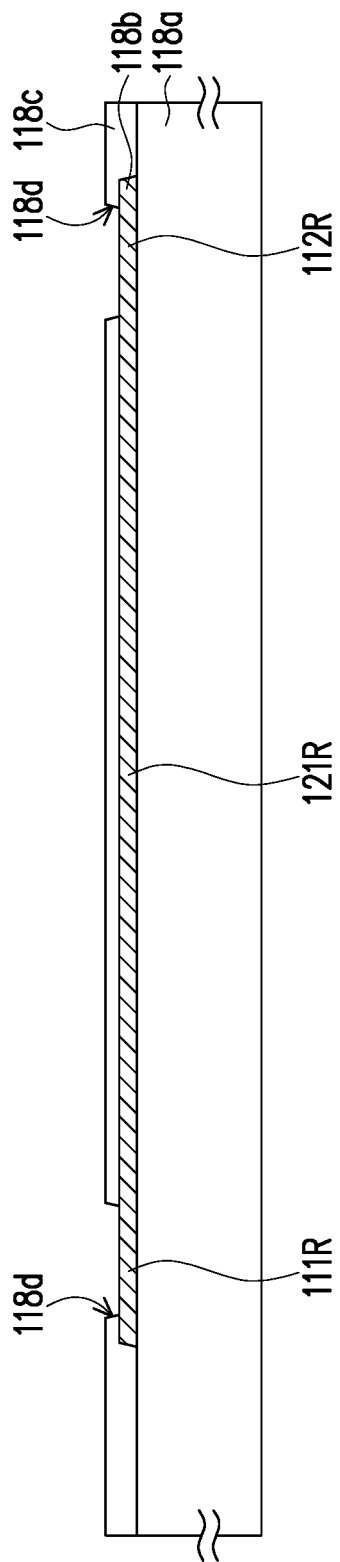
FIG. 1C is a partial cross-sectional view of a partial manufacturing method for a display panel according to the first embodiment of the disclosure.
Figure 1D:
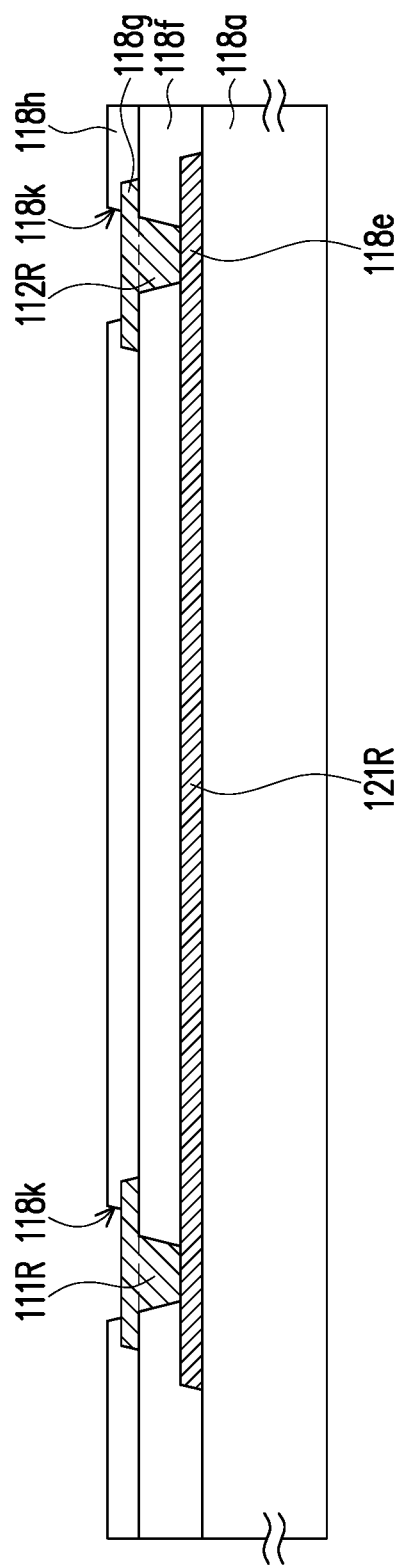
FIG. 1D is a partial cross-sectional view of a partial manufacturing method for another display panel according to the first embodiment of the disclosure.
Figure 1E:
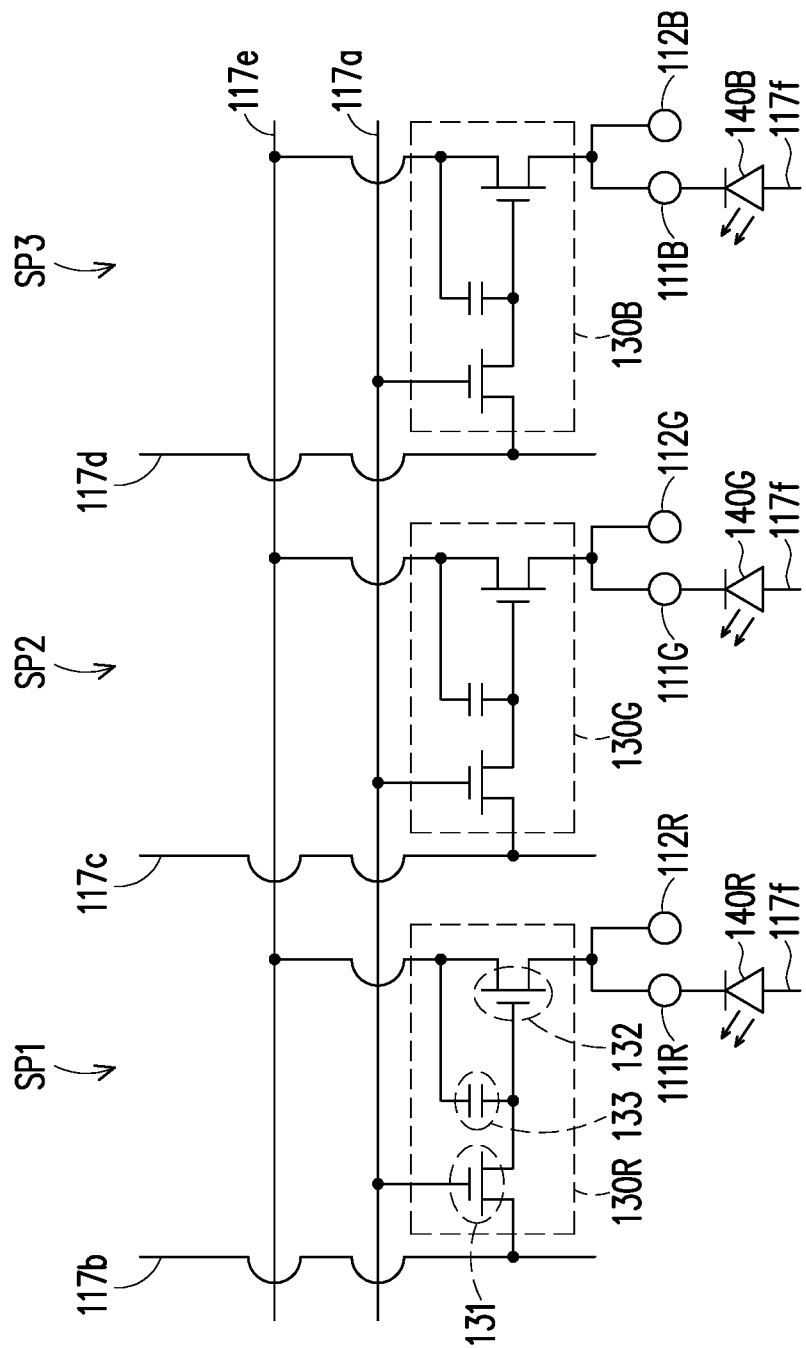
FIG. 1E is a partial schematic circuit diagram of a partial manufacturing method for a display panel according to the first embodiment of the disclosure.

FIG. 1A and FIG. 1B are partial schematic top views of a partial manufacturing method for a display panel according to the first embodiment of the disclosure. FIG. 1C is a partial cross-sectional view of a partial manufacturing method for a display panel according to the first embodiment of the disclosure. FIG. 1D is a partial cross-sectional view of a partial manufacturing method for another display panel according to the first embodiment of the disclosure. FIG. 1E is a partial schematic circuit diagram of a partial manufacturing method for a display panel according to the first embodiment of the disclosure. FIG. 1F to FIG. 1I are partial schematic top views of a display panel according to the first embodiment of the disclosure. FIG. 1J is a partial schematic top view of a partial manufacturing method for a display panel according to the first embodiment of the disclosure. FIG. 1K is a partial schematic top view of a display panel according to the first embodiment of the disclosure. FIG. 1L is a partial cross-sectional view of a display panel according to the first embodiment of the disclosure.

Referring to FIG. 1A, an array substrate 110 is provided. The array substrate 110 includes a first connection pad 112R and a second connection pad 112G.

For example, the array substrate 110 may have a pixel region PU. In FIG. 1A, only six pixel regions PU are shown for exemplary purpose, but the disclosure provides no limitation to the number of pixel regions PU. For example, the pixel region PU includes a pixel region PU1, a pixel region PU2, a pixel region PU3, a pixel region PU4, a pixel region PU5, and a pixel region PU6. The component arrangement or circuit layout in these pixel regions PU may be the same or similar. Therefore, for the purpose of clarity, not every component is denoted by a reference numeral in the overall pixel region PU.

In this embodiment, one of the pixel regions PU of the array substrate 110 may include a first connection pad 112R, a second connection pad 112G, a third connection pad 112B, a first sub-pixel pad 111R, a second sub-pixel pad 111G, a third sub-pixel pad 111B, and at least one common connection pad 113.

In an embodiment, the common connection pad 113 may include a common connection pad 113R, a common connection pad 113G, a common connection pad 113B, and a common connection pad 113P. The common connection pad 113R may be disposed corresponding to the first sub-pixel pad 111R, the common connection pad 113G may be disposed corresponding to the second sub-pixel pad 111G, the common connection pad 113B may be disposed corresponding to the third sub-pixel pad 111B, and the common connection pad 113P may be configured corresponding to the first connection pad 112R, the second connection pad 112G, and the third connection pad 112B. That is to say, in one of the pixel regions PU of the array substrate 110, the number of the common connection pads 113 may be four. For example, the common connection pad 113 may include a common connection pad 113R, a common connection pad 113G, a common connection pad 113B, and a common connection pad 113P, but the disclosure is not limited thereto.

Taking FIG. 1B as an example, the first connection pad 112R may be electrically connected to the first sub-pixel pad 111R. The second connection pad 112G can be electrically connected to the second sub-pixel pad 111G. The third connection pad 112B can be electrically connected to the third sub-pixel pad 111B.

Taking the first connection pad 112R and the first sub-pixel pad 111R as an example, the first connection pad 112R and the first sub-pixel pad 111R may be electrically connected to each other through a corresponding connection line 121R.

Taking FIG. 1C as an example, the first connection pad 112R, the first sub-pixel pad 111R, and the connection line 121 may be the same conductive layer. For example, the conductive layer 118b constituting the first connection pad 112R, the first sub-pixel pad 111R, and the connection line 121 may be located on the substrate 118a, and the conductive layer 118b may be located between the insulating layer 118c and the substrate 118a. The insulating layer 118c may have a plurality of openings 118d to expose the first connection pad 112R and the first sub-pixel pad 111R.

Taking FIG. 1D as an example, the first connection pad 112R and the first sub-pixel pad 111R are the same conductive layer, and the connection line 121 and the first connection pad 112R and the first sub-pixel SP1 may be different conductive layers. For example, the conductive layer 118e constituting the connection line 121 may be located on the substrate 118a, and the conductive layer 118e may be located between the insulating layer 118f and the substrate 118a. The conductive layer 118g constituting the first connection pad 112R and the first sub-pixel pad 111R may be located on the insulating layer 118f, and a part of the conductive layer 118g may penetrate the insulating layer 118f to connect the conductive layer 118e. The insulating layer 118h may cover the conductive layer 118g and have a plurality of openings 118k to expose the first connection pad 112R and the first sub-pixel pad 111R.

The second connection pad 112G and the second sub-pixel pad 111G can be electrically connected to each other through the corresponding connection line 121G, and the structure or arrangement of the second connection pad 112G, the second sub-pixel pad 111G and the connection line 121G may be the same as or similar to the first connection pad 112R, the first sub-pixel pad 111R, and the connection line 121R, and therefore repetition will not be narrated herein.

The third connection pad 112B and the third sub-pixel pad 111B can be electrically connected to each other through the corresponding connection line 121B, and the structure or arrangement of the third connection pad 112B, the third sub-pixel pad 111B and the connection line 121B may be the same as or similar to the first connection pad 112R, the first sub-pixel pad 111R, and the connection line 121R, and therefore repetition will not be narrated herein.

In a top view state (such as the state depicted in FIG. 1A or FIG. 1B), the first connection pad 112R, the second connection pad 112G, and the third connection pad 112B may not be arranged in a linear manner. For example, the first connection pad 112R, the second connection pad 112G, and the third connection pad 112B may be arranged in a delta-type arrangement. In another example, the contour of the first connection pad 112R, the second connection pad 112G, and the third connection pad 112B connected to each other may be an acute triangle.

Please continue to refer to FIG. 1A, a light-emitting diode (e.g., at least one of the first light-emitting diode 140R, the second light-emitting diode 140G, or the third light-emitting diode 140B) can be disposed on the array substrate 110, and the light-emitting diode is connected to (which may include direct or indirect physical connection or electrical connection) a corresponding sub-pixel pad (e.g., corresponding first sub-pixel pad 111R, second sub-pixel pad 111G or third sub-pixel pad 111B) and a corresponding common connection pad 113.

For example, referring to FIG. 1A and FIG. 1E, a first light-emitting diode 140R may be disposed on the array substrate 110. Then, the connection line 122R is connected to the first sub-pixel pad 111R and one end of the first light-emitting diode 140R, and the connection line 123 is connected to the common connection pad 113R and the other end of the first light-emitting diode 140R. In this way, the first light-emitting diode 140R can be connected to the corresponding first sub-pixel pad 111R and the common connection pad 113R.

For example, referring to FIG. 1A and FIG. 1E, a second light-emitting diode 140G may be disposed on the array substrate 110. Then, the connection line 122G is connected to the second sub-pixel pad 111G and one end of the second light-emitting diode 140G, and the connection line 123 is connected to the common connection pad 113G and the other end of the second light-emitting diode 140G. In this way, the second light-emitting diode 140G can be connected to the corresponding second sub-pixel pad 111G and the common connection pad 113G.

For example, referring to FIG. 1A and FIG. 1E, a third light-emitting diode 140B may be disposed on the array substrate 110. Then, the connection line 122B is connected to the third sub-pixel pad 111B and one end of the third light-emitting diode 140B, and the connection line 123 is connected to the common connection pad 113B and the other end of the third light-emitting diode 140B. In this way, the third light-emitting diode 140B can be connected to the corresponding third sub-pixel pad 111B and the common connection pad 113B.

It should be noted that the disclosure provides no limitation to the arrangement order of the first light-emitting diode 140R, the second light-emitting diode 140G, or the third light-emitting diode 140B.

In this embodiment, the luminous colors of the first light-emitting diode 140R, the second light-emitting diode 140G, and the third light-emitting diode 140B may be different from each other. For example, the first light-emitting diode 140R may be driven to emit red light, the second light-emitting diode 140G may be driven to emit green light, and/or the third light-emitting diode 140B may be driven to emit blue light, but the disclosure is not limited thereto.

Referring to FIG. 1E, in this embodiment, the array substrate 110 may further include a driving unit (such as: a first driving unit 130R, a second driving unit 130G, or a third driving unit 130B) and electrically connected to the first signal line 117a and the second signal line 117b, 117c or 117d of the driving unit. The light-emitting diode (e.g., at least one of the first light-emitting diode 140R, the second light-emitting diode 140G, or the third light-emitting diode 140B) can be electrically connected to the corresponding driving unit through the corresponding sub-pixel pad (e.g., corresponding first sub-pixel pad 111R, second sub-pixel pad 111G or third sub-pixel pad 111B).

For example, each pixel region PU (e.g., pixel region PU1, pixel region PU2, pixel region PU3, pixel region PU4, pixel region PU5, and pixel region PU6) may further include the first sub-pixel SP1, the second sub-pixel SP2 and the third sub-pixel SP3. The first sub-pixel SP1 at least includes the first driving unit 130R. The second sub-pixel SP2 at least includes the second driving unit 130G. The third sub-pixel SP3 at least includes the third driving unit 130B. The array substrate 110 may further include a first signal line 117a, a second signal line 117b, 117c and 117d, a first power line 117e, and a second power line 117f. The first driving unit 130R, the second driving unit 130G, and the third driving unit 130B may be electrically connected to the first signal line 117a. The first driving unit 130R, the second driving unit 130G, and the third driving unit 130B may be electrically connected to the first power line 117e. The first driving unit 130R may be electrically connected to the second signal line 117b, the second driving unit 130G may be electrically connected to another second signal line 117c, and the third driving unit 130B may be electrically connected to another second signal line 117d.

In an embodiment, the first signal line (e.g., the first signal line 117a) may be referred to as a scan line (scan line), and the second signal line (e.g., the second signal line 117b, 117c, 117d) can be referred to as a data line. In an embodiment, different pixel regions (e.g., two of the pixel region PU1, pixel region PU2, pixel region PU3, pixel region PU4, pixel region PU5, and pixel region PU6) can be distinguished by being connected to different first signal lines and/or second signal lines. For example, the pixel region PU1 and the pixel region PU2 may be connected to different second signal lines. In another example, the pixel region PU1 and the pixel region PU6 may be connected to different first signal lines. In still another example, the pixel region PU1 and the pixel region PU5 may be connected to different first signal lines and different second signal lines.

In this embodiment, the driving unit (e.g., the first driving unit 130R, the second driving unit 130G or the third driving unit 130B) of the sub-pixel (e.g., the first sub-pixel SP1, the second sub-pixel SP2 or the third sub-pixel SP3) may include a switching element 131, a driving element 132, and a capacitor 133, and may be briefly referred to as two active elements and one capacitor (which may be expressed as 2T1C). In other embodiments, the sub-pixels may further include other active elements, and the number of switch elements 131, driving elements 132, other active elements and capacitors included in the driving unit may be changed according to the design, and may be, for example briefly referred to as three active elements and one or two capacitors (which can be expressed as 3T1C/2C), four active elements and one or two capacitors (which can be expressed as 4T1C/2C), five active elements and one or two capacitors (which can be expressed as 5T1C/2C), six active elements and one or two capacitors (which can be expressed as 6T1C/2C), or other suitable circuit configuration.

In an embodiment, at least one of the switching element 131 and the driving element 132 may adopt a thin film transistor (TFT), such as a bottom gate transistor, a top gate transistor, a three-dimensional transistor, or other suitable transistors. The gate of the bottom gate transistor may be located below the semiconductor layer (not shown), the gate of the top gate transistor may be located above the semiconductor layer (not shown), and the extension of the semiconductor layer channel (not shown) of the three-dimensional transistor is not on a plane.

In the operation of the driving unit (such as: the first driving unit 130R, the second driving unit 130G, or the third driving unit 130B), the signals transmitted by the corresponding first signal line (such as: the first signal line 117a) and the corresponding second signal line (such as the second signal lines 117b, 117c, 117d) can enable the corresponding driving unit to allow the driving potential to be provided to the corresponding light-emitting diode by the first power line (such as the first power line 117e).

Taking the first sub-pixel SP1 and the corresponding first light-emitting diode 140R as an example, the gate of the switching element 131 is electrically connected to the corresponding first signal line 117a, and the source of the switching element 131 is electrically connected to the corresponding second signal line 117b, the drain of the switching element 131 is electrically connected to the gate of the driving element 132, and the source of the driving element 132 is electrically connected to the first power line 117e. The signals transmitted by the first signal line 117a and the second signal line 117b can enable the switching element 131 to control the driving element 132 to open (turn on) and close (turn off). When the driving element 132 is opened (turn on), the driving element 132 may allow its source to transmit the driving potential provided by the first power line 117e to its drain, such that the first light-emitting diode 140R may be driven to emit light.

The configuration or driving method of other sub-pixels (such as: second sub-pixel SP2 or third sub-pixel SP3) and the corresponding light-emitting diodes (such as: second light-emitting diode 140G or third light-emitting diode 140B) may be the same as or similar to the first sub-pixel SP1 and the corresponding first light-emitting diode 140R, and therefore repetition will not be narrated herein.

In this embodiment, it is not limited that the first light-emitting diode 140R, the second light-emitting diode 140G, or the third light-emitting diode 140B are known good die (KGD). That is to say, in a possible embodiment, one of the first light-emitting diode 140R, the second light-emitting diode 140G, or the third light-emitting diode 140B may be damaged, malfunctioned, or have low performance. In other words, if the light-emitting diode is unexpectedly damaged, malfunctioned or has low performance, even if the light-emitting diode is driven through the above configuration, the light-emitting diode may still not emit light or have the brightness as expected. Therefore, after configuring the corresponding light-emitting diodes (e.g., at least one of the first light-emitting diode 140R, the second light-emitting diode 140G, or the third light-emitting diode 140B), the configured light-emitting diodes may be subjected to a test step or an inspection step.

The test step may be the same or similar to the commonly adopted test step, and the inspection step may be the same or similar to the commonly adopted test step, so they are not described in detail here. Simply speaking, for example, the corresponding light-emitting diode (e.g., at least one of the first light-emitting diode 140R, the second light-emitting diode 140G, or the third light-emitting diode 140B) can be driven by the driving unit to make sure whether the driven light-emitting diode emits light or has the brightness as expected. Briefly, in another example, appearance inspection (e.g., optical microscope (OM) inspection) can be carried out to make sure whether the appearance of the inspected light-emitting diode (e.g., at least one of the first light-emitting diode 140R, the second light-emitting diode 140G or the third light-emitting diode 140B) is normal.

After going through the test step or inspection step, the damaged, malfunctioned or low-efficiency light-emitting diodes can be repaired. The foregoing repair method may include: disposing a light-emitting diode (e.g., at least one of the first light-emitting diode 141R, the second light-emitting diode 141G, or the third light-emitting diode 141B) on the array substrate 110, and making the light-emitting diode to completely overlap one connection pad (e.g., one of the first connection pad 112R, the second connection pad 112G, or the third connection pad 112B) and not completely overlap the other connection pad (e.g., the other one of the first connection pad 112R, the second connection pad 112G, or the third connection pad 112B). Furthermore, the light-emitting diode is electrically connected to the other connection pad.

The foregoing repair method is detailed and exemplified as follows.

Taking Repairing Pixel Region PU1 as an Example

Figure 1F:
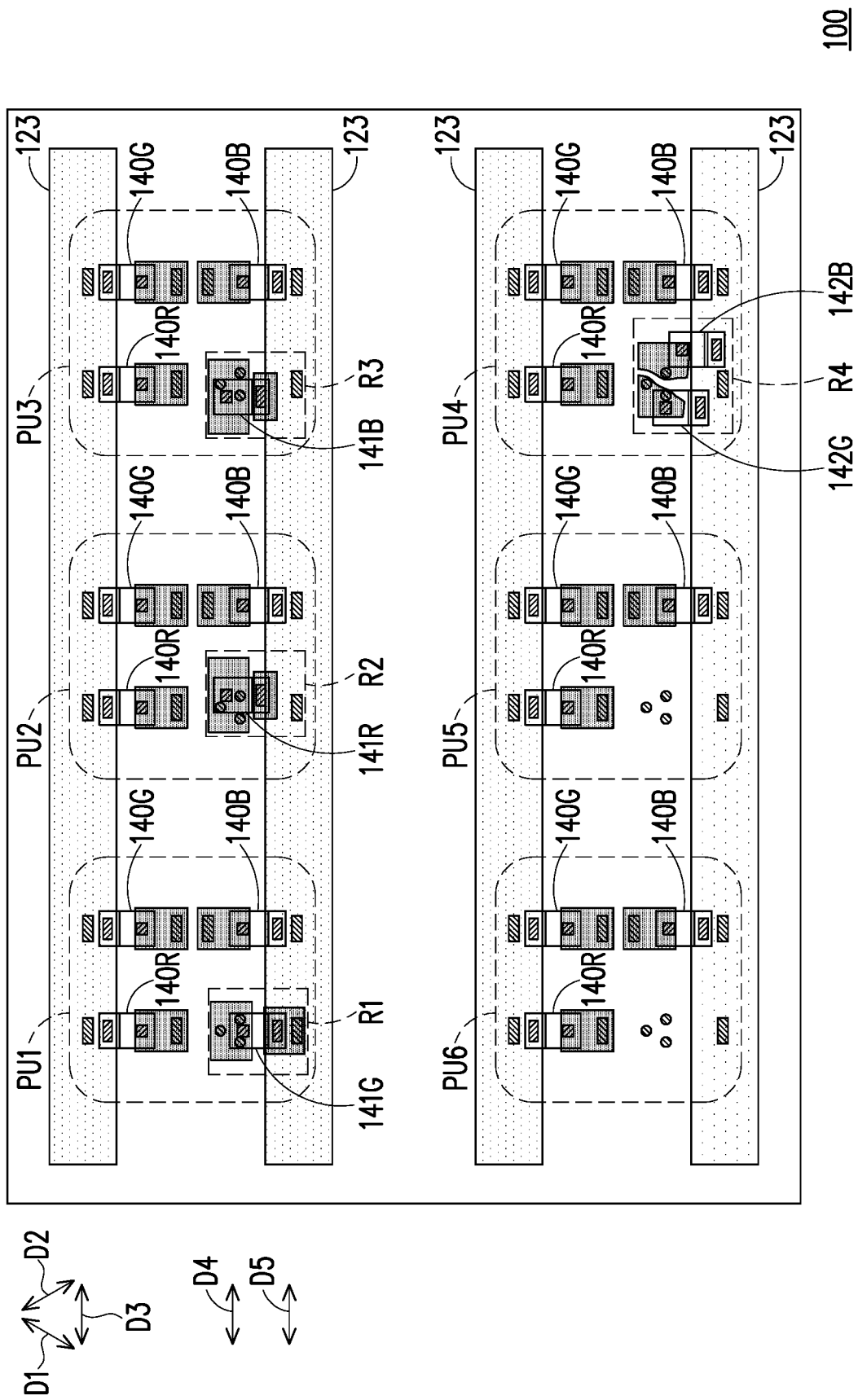
FIG. 1F to FIG. 1I are partial schematic top views of a display panel according to the first embodiment of the disclosure.
Figure 1G:
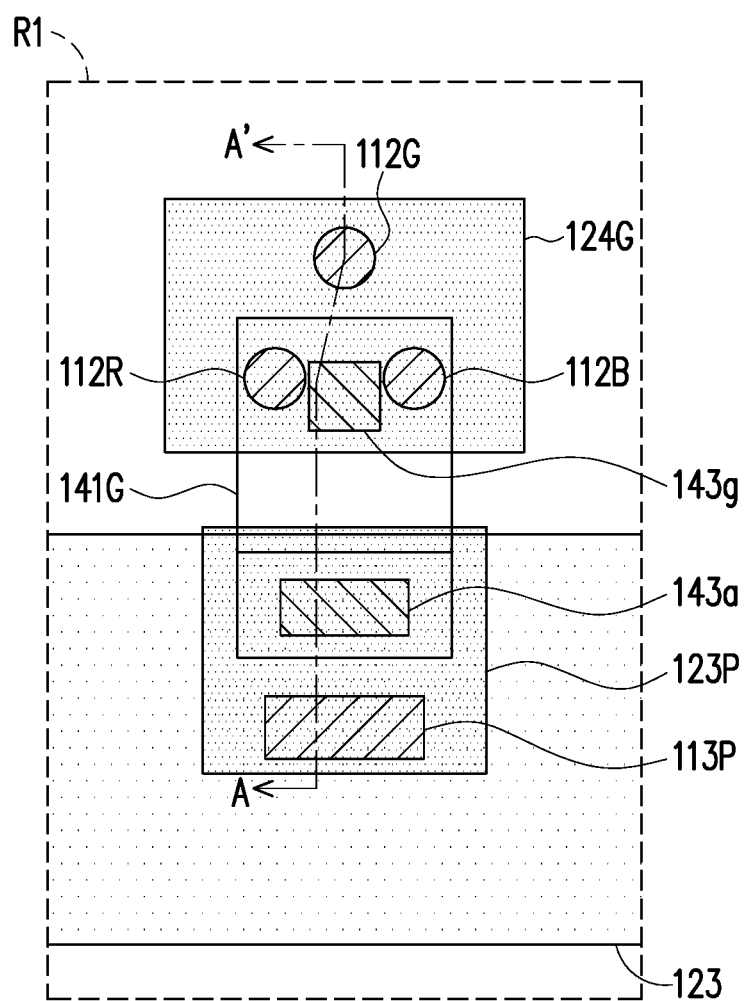
Figure 1H:
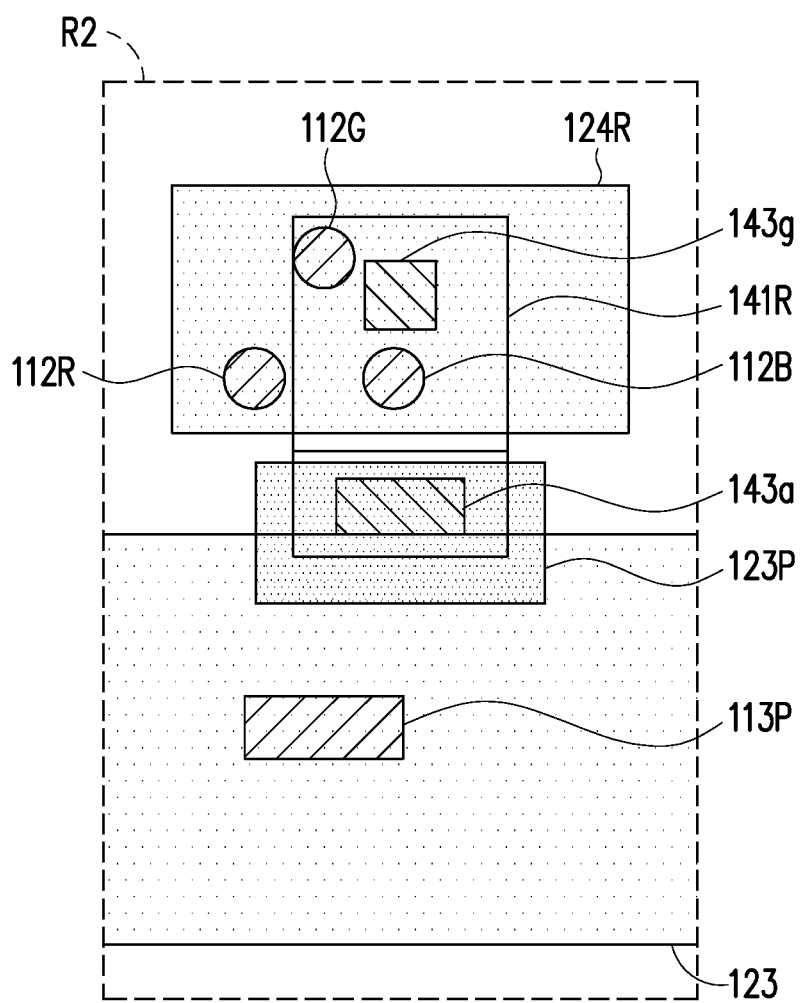
Figure 1I:
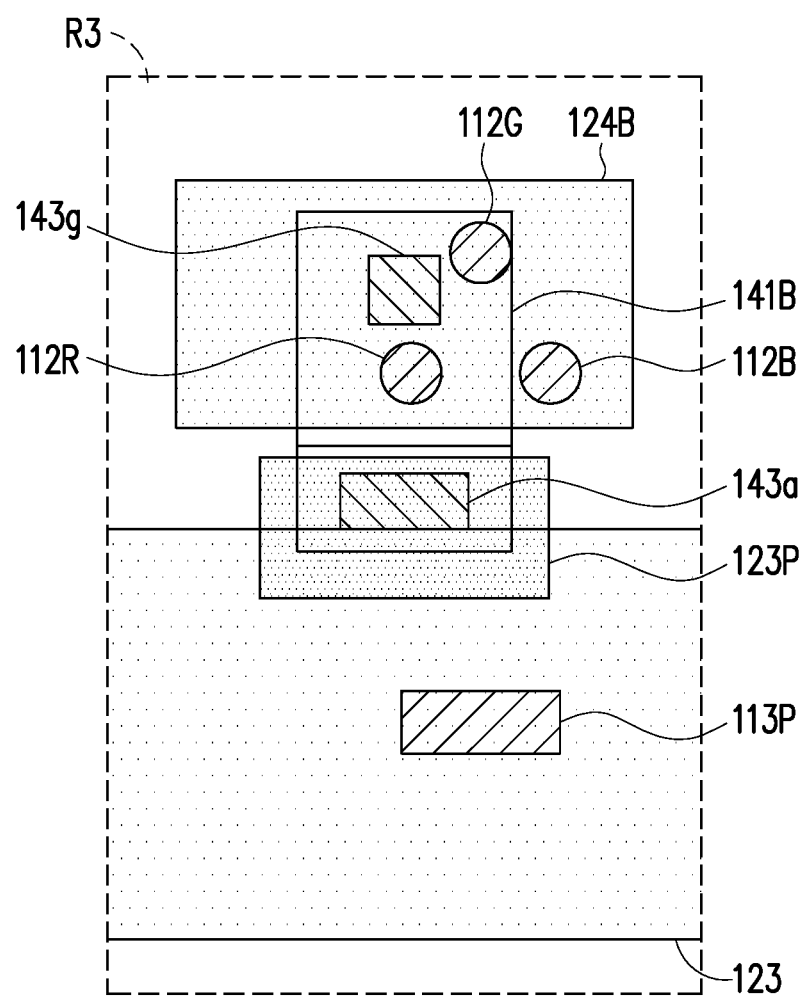
Figure 1J:
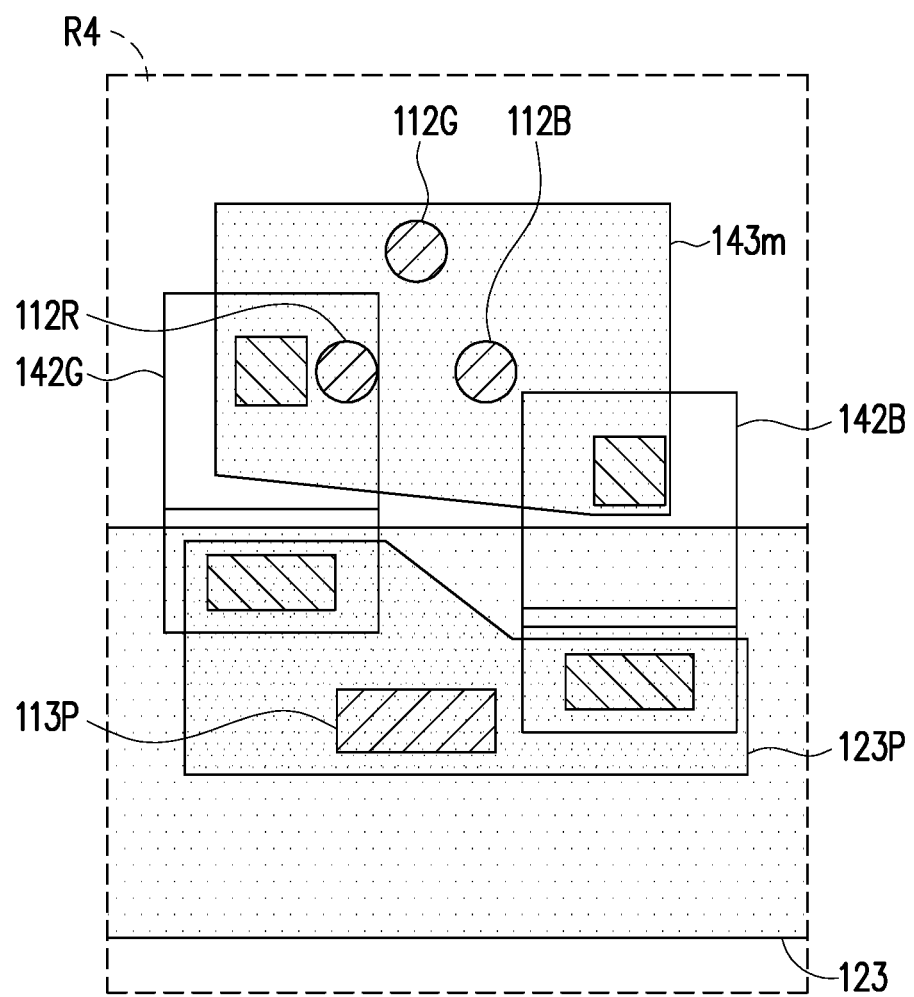
FIG. 1J is a partial schematic top view of a partial manufacturing method for a display panel according to the first embodiment of the disclosure.
Figure 1K:
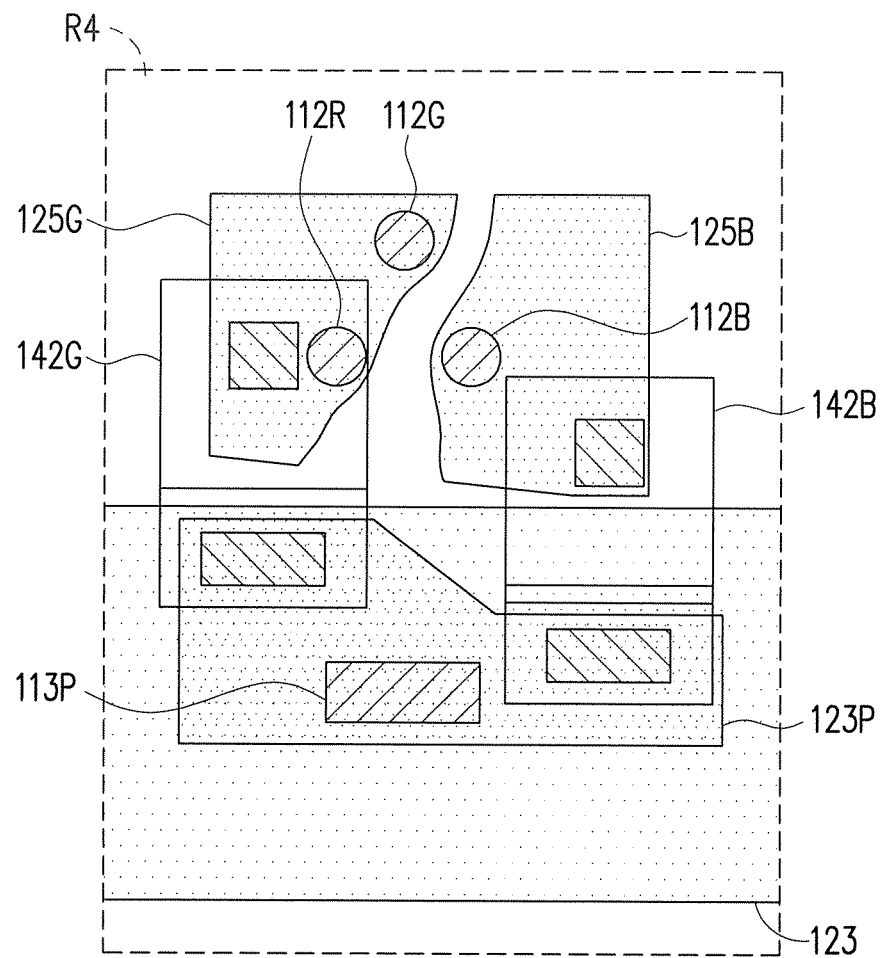
FIG. 1K is a partial schematic top view of a display panel according to the first embodiment of the disclosure.
Figure 1L:
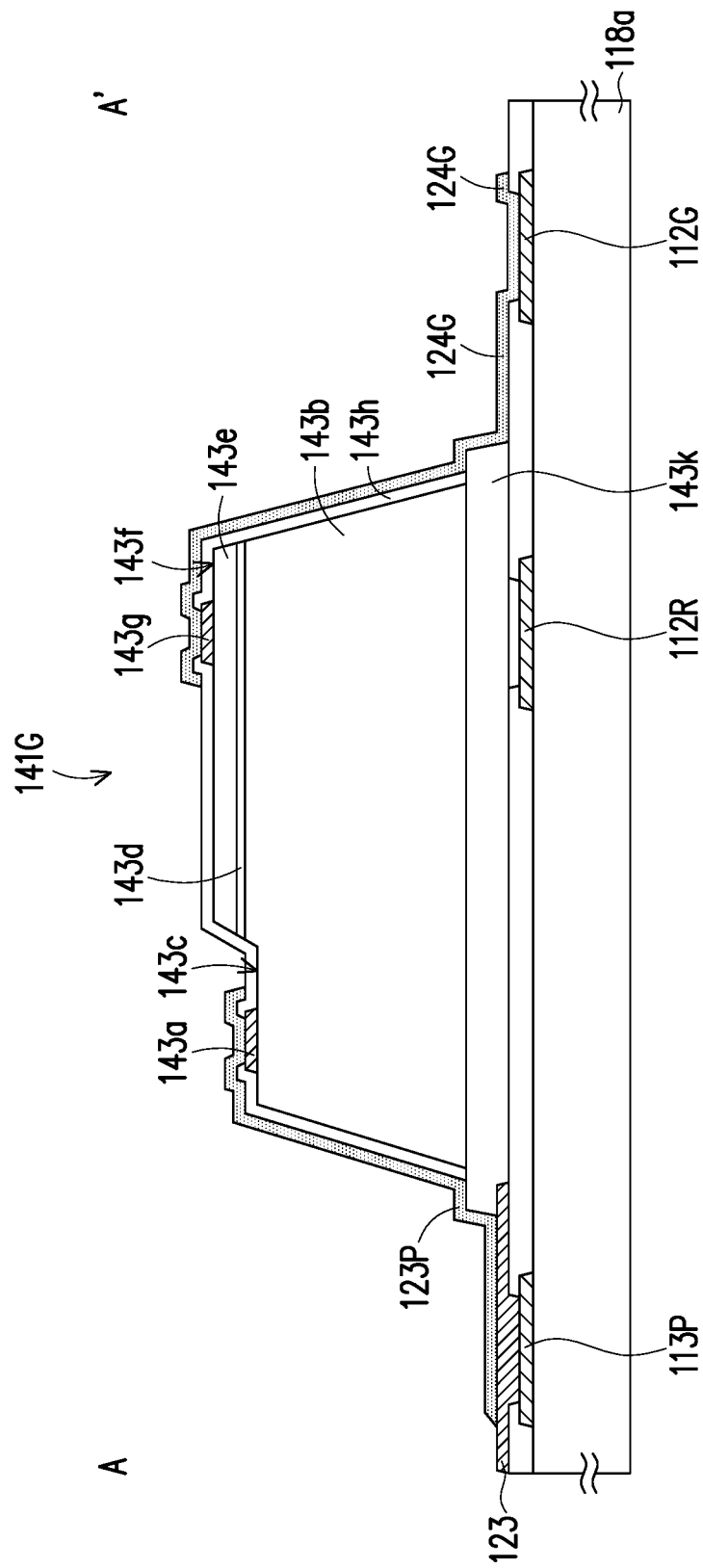
FIG. 1L is a partial cross-sectional view of a display panel according to the first embodiment of the disclosure.

For example, please refer to FIG. 1A, FIG. 1F, FIG. 1G and FIG. 1L, FIG. 1F may be a partial top schematic view of at least repairing a part of the pixel region PU1 of the structure in FIG. 1A, FIG. 1G may be an enlarged schematic top view of the region R1 in FIG. 1F, and FIG. 1L may be a schematic cross-sectional view of FIG. 1G taken along sectional line A-A'. In addition, in FIG. 1G and FIG. 1L, some of the components may not be located on the cross section taken along the sectional line A-A'. However, for easy representation or explanation, the projection of some components on the cross section may be shown. For example, the first connection pad 112R is not located on the sectional line A-A' in FIG. 1G. However, for easy representation or explanation, the position of the projection of the first connection pad 112R on the section is still shown in FIG. 1L.

In this embodiment, after performing the test step or the inspection step to the second light-emitting diode 140G disposed in the pixel region PU1, if the second light-emitting diode 140G is deemed not to have the expected light emission, then, another second light-emitting diode 141G may be disposed on the array substrate 110. The luminous color or brightness of the second light-emitting diode 141G may be substantially the same as or similar to the originally expected color or brightness of the second light-emitting diode 140G. The second light-emitting diode 141G completely overlaps the third connection pad 112B and the first connection pad 112R, and the second light-emitting diode 140G does not completely overlap (e.g., partially overlap or completely non-overlap) the second connection pad 112G. Then, the second connection pad 112G may be electrically connected to one end of the second light-emitting diode 141G, and the common connection pad 113P may be electrically connected to the other end of the second light-emitting diode 141G. In this way, through the same or similar driving method for the second light-emitting diode 140G, the second light-emitting diode 141G may be driven to emit light.

In the embodiment, the second light-emitting diode 141G may be a lateral type light-emitting diode. For example, the second light-emitting diode 141G may include a first electrode 143a, a first type semiconductor layer 143b, a light-emitting region 143d, a second type semiconductor layer 143e, a second electrode 143g, and an insulating layer 143h. The light-emitting region 143d is located between the first type semiconductor layer 143b and the second type semiconductor layer 143e. The first type semiconductor layer 143b has a first wire connection surface 143c. The second type semiconductor layer 143e has a second wire connection surface 143f. The first wire connection surface 143c of the first type semiconductor layer 143b and the second wire connection surface 143f of the second type semiconductor layer 143e substantially face the same direction. The first electrode 143a is located on the first wire connection surface 143c of the first type semiconductor layer 143b and is electrically connected to the first type semiconductor layer 143b. The second electrode 143g is located on the second wire connection surface 143f of the second type semiconductor layer 143e and is electrically connected to the second type semiconductor layer 143e. The insulating layer 143h covers the first electrode 143a, the first type semiconductor layer 143b, the light-emitting region 143d, the second type semiconductor layer 143e, and the second electrode 143g, and the insulating layer may expose a part of the first electrode 143a and a part of the second electrode 143g.

In this embodiment, the first type semiconductor layer 143b is an N-type semiconductor layer, and the second type semiconductor layer 143e is a P-type semiconductor layer, but the disclosure is not limited thereto. The material of the N-type semiconductor layer is, for example, N-type gallium nitride (n-GaN) doped with group IVA elements (such as silicon), and the material of the P-type semiconductor layer is, for example, P-type gallium nitride (p-GaN) doped with group IIA elements (e.g., magnesium), but the disclosure is not limited thereto. The light-emitting region 143d has, for example, a multiple quantum well (MQW) structure. The multiple quantum well structure includes multiple quantum well layers and multiple quantum barrier layers alternately arranged in a repeated manner. Further, the material of the light-emitting region 143d includes, for example, alternately stacked multilayer indium gallium nitride and multilayer gallium nitride (InGaN/GaN). By designing the ratio of indium or gallium in the light-emitting region, the light-emitting region can emit light with different wavelength ranges. The first-type semiconductor layer 143b, the light-emitting region 143d, and the second type semiconductor layer 143e can be formed by, for example, metal-organic chemical vapor deposition (MOCVD). It should be noted that the materials or formation method of the first type semiconductor layer 143b, the light-emitting region 143d, or the second type semiconductor layer 143e is described for exemplary purpose, and the disclosure is not limited thereto. For example, the light-emitting region 143d may also be a light-emitting interface formed by the first type semiconductor layer 143b and the second type semiconductor layer 143e. In other words, by adjusting the material, composition, structure or doping concentration of the light-emitting region 143d, the second light-emitting diode 140G can have a corresponding luminous color.

In this embodiment, the connection line 124G may cover the second light-emitting diode 141G, such that the second connection pad 112G is connected with one end of the second light-emitting diode 141G through the connection line 124G, but the disclosure is not limited thereto.

In this embodiment, the connection line 123P may cover the second light-emitting diode 141G, such that the common connection pad 113P is connected with the other end of the second light-emitting diode 141G through the connection line 123P, but the disclosure is not limited thereto. For example, the second light-emitting diode 141G can be electrically connected to the common connection pad 113P through the connection line 123P and the connection line 123.

In this embodiment, an insulating layer 143k may be provided between the second light-emitting diode 141G and the array substrate 110. The insulating layer 143k may be an inorganic insulating layer deposited on the first type semiconductor layer 143b; alternatively, the insulating layer 143k may be an organic insulating layer coated or adhered on the first type semiconductor layer 143b, but the disclosure is not limited thereto. The second light-emitting diode 141G can be physically separated or electrically isolated from the third connection pad 112B and the first connection pad 112R by the insulating layer 143k.

In this embodiment, in a top view state (such as the state depicted in FIG. 1F), the contour of the first light-emitting diode 140R, the second light-emitting diode 140G, and the third light-emitting diode 140B connected to each other in the pixel region PU1 may be similar to the contour of the first light-emitting diode 140R, the second light-emitting diode 141G, and the third light-emitting diode 140B connected to each other in the pixel region PU1. That is to say, within the range of the pixel region PU1, after the second light-emitting diode 140G is repaired, replaced, or substituted with the second light-emitting diode 141G, the visual difference between them may not be too obvious, so that the display panel 100 can have a better display quality.

In this embodiment, in a top view state (such as the state depicted in FIG. 1F), there is no other light-emitting diode in the contour of the first light-emitting diode 140R, the second light-emitting diode 140G, and the third light-emitting diode 140B connected to each other in the pixel region PU1, and/or there is no other light-emitting diode in the contour of the first light-emitting diode 140R, the second light-emitting diode 141G, and the third light-emitting diode 140B connected to each other in the pixel region PU1.

Taking Repairing the Pixel Region PU2 as an Example

For example, please refer to FIG. 1A, FIG. 1F and FIG. 1H, FIG. 1F may be a partial schematic top view of at least repairing a part of the pixel region PU2 of the structure in FIG. 1A, and FIG. 1H may be an enlarged schematic top view of the region R2 in FIG. 1F.

In this embodiment, after performing the test step or the inspection step to the first light-emitting diode 140R disposed in the pixel region PU2, if the first light-emitting diode 140R is deemed not to have the expected light emission, then, another first light-emitting diode 141R can be disposed on the array substrate 110. The luminous color or brightness of the first light-emitting diode 141R may be substantially the same as or similar to the originally expected color or brightness of the first light-emitting diode 140R. The first light-emitting diode 141R completely overlaps the second connection pad 112G and the third connection pad 112B, and the first light-emitting diode 140R does not completely overlap (e.g., partially overlap or completely non-overlap) the first connection pad 112R. Then, the first connection pad 112R may be electrically connected to one end of the first light-emitting diode 140R, and the common connection pad 113P may be electrically connected to the other end of the first light-emitting diode 141R. In this way, by the same or similar driving method for the first light-emitting diode 140R, the first light-emitting diode 141R may be driven to emit light.

In this embodiment, the first light-emitting diode 141R may be a lateral type light-emitting diode similar to the second light-emitting diode 141G. The difference is that the material, composition, structure or doping concentration of the light-emitting region of the first light-emitting diode 141R is different from the material, composition, structure or doping concentration of the light-emitting region of the second light-emitting diode 141G. In this way, the first light-emitting diode 141R can have a different luminous color than the second light-emitting diode 141G.

In this embodiment, the connection line 124R may cover the first light-emitting diode 141R, such that the first connection pad 112R is connected with one end of the first light-emitting diode 141R through the connection line 124R, but the disclosure is not limited thereto.

In this embodiment, the connection line 123P may cover the first light-emitting diode 141R, such that the common connection pad 113P is connected with the other end of the first light-emitting diode 141R through the connection line 123P, but the disclosure is not limited thereto. For example, the first light-emitting diode 141R can be electrically connected to the common connection pad 113P through the connection line 123P and the connection line 123.

In this embodiment, an insulating layer (not shown, which is similar to the insulating layer 143k between the second light-emitting diode 141G and the array substrate 110) may be provided between the first light-emitting diode 141R and the array substrate 110. The first light-emitting diode 141R can be physically separated or electrically isolated from the second connection pad 112G and the third connection pad 112B through the insulating layer.

In this embodiment, in a top view state (such as the state depicted in FIG. 1F), the contour of the first light-emitting diode 140R, the second light-emitting diode 140G, and the third light-emitting diode 140B connected to each other in the pixel region PU2 may be similar to the contour of the first light-emitting diode 141R, the second light-emitting diode 140G, and the third light-emitting diode 140B connected to each other in pixel region PU2. That is to say, within the range of the pixel region PU2, after the first light-emitting diode 140R is repaired, replaced or substituted with the first light-emitting diode 141R, the visual difference between them may not be too obvious, and the display panel 100 can have a better display quality.

In this embodiment, in a top view state (such as the state depicted in FIG. 1F), there is no other light-emitting diode in the contour of the first light-emitting diode 140R, the second light-emitting diode 140G, and the third light-emitting diode 140B connected to each other in the pixel region PU2, and/or there is no other light-emitting diode in the contour of the first light-emitting diode 141R, the second light-emitting diode 140G, and the third light-emitting diode 140B connected to each other in the pixel region PU2.

Taking Repairing the Pixel Region PU3 as an Example

For example, please refer to FIG. 1A, FIG. 1F and FIG. 1I, FIG. 1F may be a partial schematic top view of at least repairing a part of the pixel region PU3 of the structure in FIG. 1A, and FIG. 1I may be an enlarged schematic top view of the region R3 in FIG. 1F.

In this embodiment, after performing the test step or the inspection step to the third light-emitting diode 140B disposed in the pixel region PU3, if the third light-emitting diode 140B is deemed not to have the expected light emission, then, another third light-emitting diode 141B may be disposed on the array substrate 110. The luminous color or brightness of the third light-emitting diode 141B may be substantially the same as or similar to the originally expected color or brightness of the third light-emitting diode 140B. The third light-emitting diode 141B completely overlaps the first connection pad 112R and the second connection pad 112G, and the third light-emitting diode 141B does not completely overlap (e.g., partially overlap or completely non-overlap) the third connection pad 112B. Then, the third connection pad 112B may be electrically connected to one end of the third light-emitting diode 141B, and the common connection pad 113P may be electrically connected to the other end of the third light-emitting diode 141B. In this way, through the same or similar driving method for the third light-emitting diode 140B, the third light-emitting diode 141B may be driven to emit light.

In this embodiment, the third light-emitting diode 141B may be a lateral type light-emitting diode similar to the first light-emitting diode 141R or the second light-emitting diode 141G. The difference is that the material, composition, structure or doping concentration of the light-emitting region of the third light-emitting diode 141B is different from the material, composition, structure or doping concentration of the light-emitting region of the first light-emitting diode 141R or the second light-emitting diode 141G. In this way, the third light-emitting diode 141B can have a different luminous color than the first light-emitting diode 141R or the second light-emitting diode 141G.

In this embodiment, the connection line 124B may cover the third light-emitting diode 141B, such that the third connection pad 112B is connected with one end of the third light-emitting diode 141B through the connection line 124B, but the disclosure is not limited thereto.

In this embodiment, the connection line 123P may cover the third light-emitting diode 141B, such that the common connection pad 113P is connected with the other end of the third light-emitting diode 141B through the connection line 123P, but the disclosure is not limited thereto. For example, the third light-emitting diode 141B can be electrically connected to the common connection pad 113P through the connection line 123P and the connection line 123.

In this embodiment, an insulating layer (not shown, which is similar to the insulating layer 143k between the second light-emitting diode 141G and the array substrate 110) may be provided between the third light-emitting diode 141B and the array substrate 110. The third light-emitting diode 141B can be physically separated or electrically isolated from the first connection pad 112R and the second connection pad 112G through the insulating layer.

In this embodiment, in a top view state (such as the state depicted in FIG. 1F), the contour of the first light-emitting diode 140R, the second light-emitting diode 140G, and the third light-emitting diode 140B connected to each other in the pixel region PU3 may be similar to the contour of the first light-emitting diode 140R, the second light-emitting diode 140G, and the third light-emitting diode 141B connected to each other in the pixel region PU3. That is to say, within the range of the pixel region PU3, after the third light-emitting diode 140B is repaired, replaced, or substituted with the third light-emitting diode 141B, the visual difference between them may not be too obvious, so that the display panel 100 can have a better display quality.

In this embodiment, in a top view state (such as the state depicted in FIG. 1F), there is no other light-emitting diode in the contour of the first light-emitting diode 140R, the second light-emitting diode 140G, and the third light-emitting diode 140B connected to each other in the pixel region PU1, and/or there is no other light-emitting diode in the contour of the first light-emitting diode 140R, the second light-emitting diode 140G, and the third light-emitting diode 141B connected to each other in the pixel region PU1.

Taking Repairing Pixel Region PU4 as an Example

For example, please refer to FIG. 1A, FIG. 1F, FIG. 1J and FIG. 1K, FIG. 1F may be a partial top schematic view of at least repairing a part of the pixel region PU4 of the structure in FIG. 1A, FIG. 1J may be a partial schematic top view of a partial manufacturing method for the display panel corresponding to the region R4 in FIG. 1F, FIG. 1K may be an enlarged schematic top view of the region R4 in FIG. 1F.

In this embodiment, after performing the test step or the inspection step to the second light-emitting diode 140G and the third light-emitting diode 140B disposed on the array substrate 110, if the second light-emitting diode 140G and the third light-emitting diode 140B are deemed not to have the expected light emission, then, another second light-emitting diode 142G and another third light-emitting diode 142B may be disposed on the array substrate 110. The luminous color or brightness of the second light-emitting diode 142G may be substantially the same as or similar to the originally expected color or brightness of the second light-emitting diode 140G. The luminous color or brightness of the third light-emitting diode 142B may be substantially the same as or similar to the originally expected color or brightness of the third light-emitting diode 140B. The second light-emitting diode 142G completely overlaps the first connection pad 112R, and the second light-emitting diode 142G does not completely overlap (e.g., partially overlap or completely non-overlap) the second connection pad 112G, and the second light-emitting diode 142G completely non-overlaps the third connection pad 112B. The third light-emitting diode 142B does not completely overlap (e.g., partially overlap or completely non-overlap) the third connection pad 112B, and the third light-emitting diode 142B completely non-overlaps the second connection pad 112G. Then, the second connection pad 112G may be electrically connected to one end of the second light-emitting diode 142G, the third connection pad 112B may be electrically connected to one end of the third light-emitting diode 142B, and the common connection pad 113P and the other end of the second light-emitting diode 142G may be electrically connected to the other end of the third light-emitting diode 142B. In this way, through the same or similar driving method for the second light-emitting diode 140G, the second light-emitting diode 142G may be driven to emit light. Moreover, through the same or similar driving method for the third light-emitting diode 140B, the third light-emitting diode 142B may be driven to emit light.

Please refer to FIG. 1J to FIG. 1K. For example, as shown in FIG. 1J, a conductive layer 143m may be first formed on the second light-emitting diode 142G and the third light-emitting diode 142B. Then, a portion of the conductive layer 143m (labeled in FIG. 1J) can be removed by laser cutting technology to form the connection line 125G and the connection line 125B as shown in FIG. 1K. The connection line 125G and the connection line 125B may be physically separated or electrically isolated from each other. The connection line 125G may cover the second light-emitting diode 142G, such that the second connection pad 112G is connected with one end of the second light-emitting diode 142G through the connection line 125G. The connection line 125B may cover the third light-emitting diode 142B, such that the third connection pad 112B is connected with one end of the third light-emitting diode 142B through the connection line 125B.

In this embodiment, the connection line 123P may cover the second light-emitting diode 142G and the third light-emitting diode 142B, such that the common connection pad 113P is connected with the other end of the second light-emitting diode 142G and the other end of the third light-emitting diode 142B through the connection line 123P, but the disclosure is not limited thereto. For example, the second light-emitting diode 142G and the third light-emitting diode 142B can be electrically connected to the common connection pad 113P through the connection line 123P and the connection line 123.

In this embodiment, an insulating layer (not shown, which is similar to the insulating layer 143k between the second light-emitting diode 141G and the array substrate 110) may be provided between the second light-emitting diode 142G and the array substrate 110. The second light-emitting diode 142G can be physically separated or electrically isolated from the first connection pad 112R through the insulating layer.

In this embodiment, in the same pixel region PU, the connection line between the first connection pad 112R and the second connection pad 112G is a first distance L1 (labeled in FIG. 1B). The connection line between the second connection pad 112G and the third connection pad 112B is a second distance L2 (marked in FIG. 1B). The connection line between the third connection pad 112B and the first connection pad 112R is a third distance L3 (marked in FIG. 1B). The connection line between the first light-emitting diode 140R and the second light-emitting diode 140G is a first pixel pitch P1 (which can be regarded as the distance between the first sub-pixel SP1 and the second sub-pixel SP2; shown in FIG. 1A). The connection line between the second light-emitting diode 140G and the third light-emitting diode 140B is a second pixel pitch P2 (which can be regarded as the distance between the second sub-pixel SP2 and the third sub-pixel SP3; marked in FIG. 1A). The connection line between the third light-emitting diode 140B and the first light-emitting diode 140R is a third pixel pitch P3 (which can be regarded as the distance between the third sub-pixel SP3 and the first sub-pixel SP1; marked in FIG. 1A). The first distance L1, the second distance L2 and the third distance L3 are smaller than the first pixel pitch P1, the second pixel pitch P2 and the third pixel pitch P3. In an embodiment, with the above-mentioned arrangement, at least one of the first light-emitting diode 141R, the second light-emitting diode 141G, or the third light-emitting diode 141B can be easily configured. In an embodiment, the second light-emitting diode 142G and the third light-emitting diode 142B can be more easily configured by the above-mentioned arrangement.

In this embodiment, the connection line between the first connection pad 112R and the second connection pad 112G has a first direction D1, the connection line between the second connection pad 112G and the third connection pad 112B has a second direction D2, and the connection line between the third connection pad 112B and the first connection pad 112R has a third direction D3. There is a first dimension direction D4 at the smallest dimension of the first light-emitting diode 140R, the second light-emitting diode 140G, and the third light-emitting diode 140B, and one of the first direction D1, the second direction D2, and the third direction D3 is substantially parallel to the first dimension direction D4. For example, in a top view state (such as the state depicted in FIG. 1F), the appearance contour of the first light-emitting diode 140R, the second light-emitting diode 140G, and the third light-emitting diode 140B may be substantially the same as or similar to a rectangle. There is the first dimension direction D4 at the width of the first light-emitting diode 140R, the second light-emitting diode 140G, or the third light-emitting diode 140B, and the third direction D3 is substantially parallel to the first dimension direction D4. In an embodiment, there is a second dimension direction D5 at the smallest dimension of the first light-emitting diode 141R, the second light-emitting diode 141G, or the third light-emitting diode 141B, and the second dimension direction D5 is substantially parallel to the first dimension direction D4. In an embodiment, by the above-mentioned arrangement, the replaced orientation of at least one of the first light-emitting diode 141R, the second light-emitting diode 141G, or the third light-emitting diode 141B can be the same as or similar to the replaced orientation of the third light-emitting diode 140B, such that the layout design of the connection line 123P can be relatively simple.

In this embodiment, in a direction (e.g., the second dimension direction D5), the maximum dimension of the first light-emitting diode 141R, the second light-emitting diode 141G, or the third light-emitting diode 141B is greater than the first distance L1, the second distance L2, and the third distance L3. In an embodiment, with the above-mentioned arrangement, when one of the first light-emitting diode 141R, the second light-emitting diode 141G, or the third light-emitting diode 141B is configured, it is more easily for one of them to completely overlap one of the first connection pad 112R, the second connection pad 112G, or the third connection pad 112B and not completely overlap the other one of the first connection pad 112R, the second connection pad 112G, or the third connection pad 112B.

Through the layout design, configuration method or repair method described above, the damaged, malfunctioned or low-efficiency light-emitting diodes can be repaired and thus the display panel 100 can have a better display quality.

Figure 2:
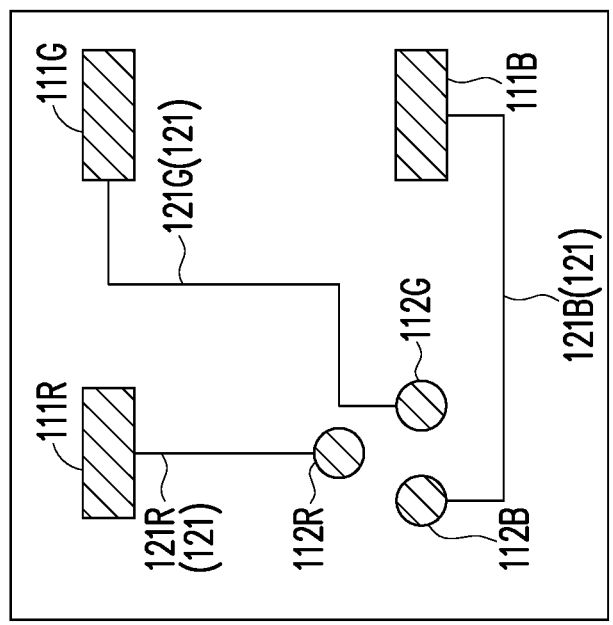
FIG. 2 is a partial schematic top view of a display panel according to the second embodiment of the disclosure.
Figure 2:
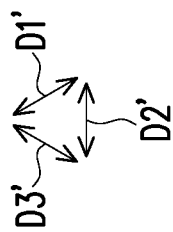

FIG. 2 is a partial schematic top view of a display panel according to the second embodiment of the disclosure. For clarity, FIG. 2 omits some of the layers or components in the drawing. The display panel 200 of the second embodiment is similar to the display panel 100 of the first embodiment. Therefore, in the description or drawings of the display panel 200 of the second embodiment, the same or similar reference numerals represent the same or similar components, so the components described in the first embodiment will not be repeated here.

In this embodiment, there is a first direction D1' for the connection line between the first connection pad 112R and the second connection pad 112G. There is a second direction D2' for the connection line between the second connection pad 112G and the third connection pad 112B. There is a third direction D3' for the connection line between the third connection pad 112B and the first connection pad 112R. One of the first direction D1', the second direction D2' and the third direction D3' is substantially parallel to the first dimension direction D4. For example, in a top view state (e.g., similar to the state depicted in FIG. 1F), the second direction D2' is substantially parallel to the first dimension direction D4. In an embodiment, there is a second dimension direction D5 at the smallest dimension of the first light-emitting diode 141R, the second light-emitting diode 141G, and the third light-emitting diode 141B, and the second dimension direction D5 is substantially parallel to the first dimension direction D4. In an embodiment, by the arrangement described above, the replaced orientation of at least one of the first light-emitting diode 141R, the second light-emitting diode 141G, or the third light-emitting diode 141B can be the same as or similar to the replaced orientation of the third light-emitting diode 140B, such that the layout design of the connection line 123P can be relatively simple.

Through the layout design, configuration method or repair method described above, the damaged, malfunctioned or low-efficiency light-emitting diodes can be repaired and thus the display panel 200 can have a better display quality.

Figure 3:
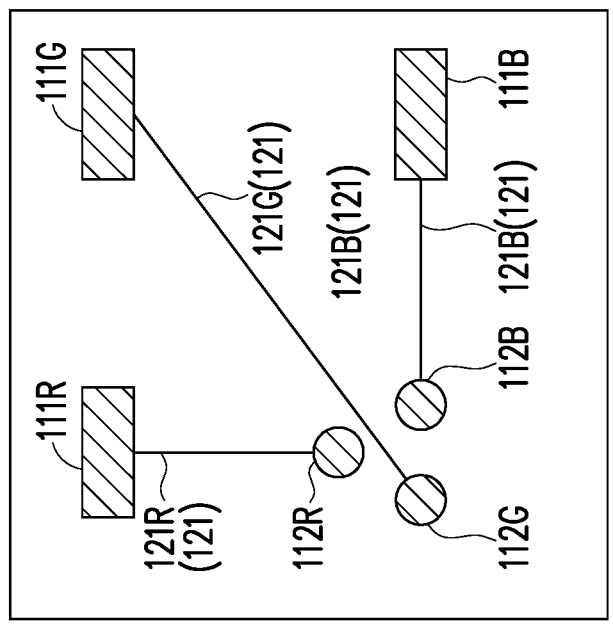
FIG. 3 is a partial schematic top view of a display panel according to the third embodiment of the disclosure.
Figure 3:
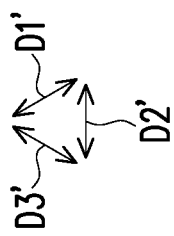

FIG. 3 is a partial schematic top view of a display panel according to the third embodiment of the disclosure. For clarity, FIG. 3 omits some of the layers or components in the drawing. The display panel 300 of the third embodiment is similar to the display panel 100 of the first embodiment. Therefore, in the description or drawings of the display panel 300 of the third embodiment, the same or similar reference numerals represent the same or similar components, so the components described in the first embodiment will not be repeated here.

In this embodiment, in a top view state (e.g., similar to the state depicted in FIG. 3), part of the connection line 121 may be located between two of the first connection pad 112R, the second connection pad 112G, and the third connection pad 112B. Taking FIG. 3 as an example, the connection line 121G for connecting the second connection pad 112G may be located between the first connection pad 112R and the third connection pad 112B.

Through the layout design, configuration method or repair method described above, the damaged, malfunctioned or low-efficiency light-emitting diodes can be repaired and thus the display panel 300 can have a better display quality.

Figure 4A:
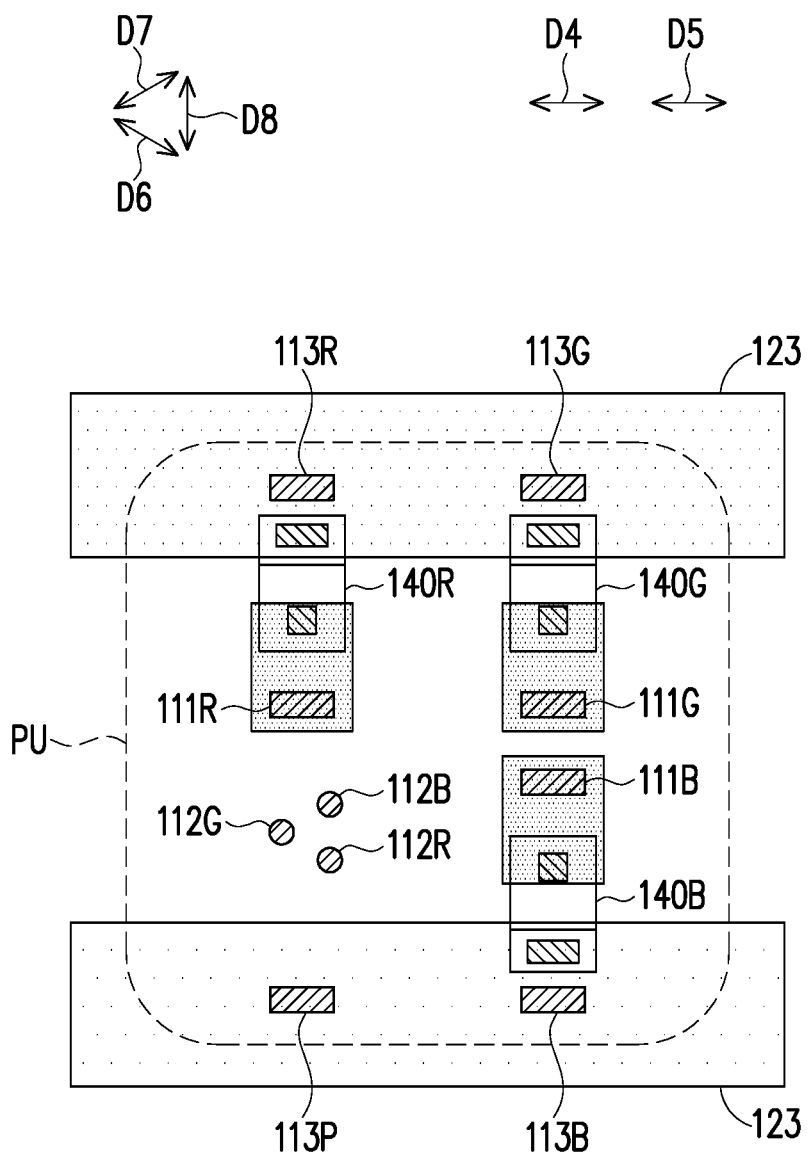
FIG. 4A is a partial schematic top view of a partial manufacturing method for a display panel according to the fourth embodiment of the disclosure.
Figure 4B:
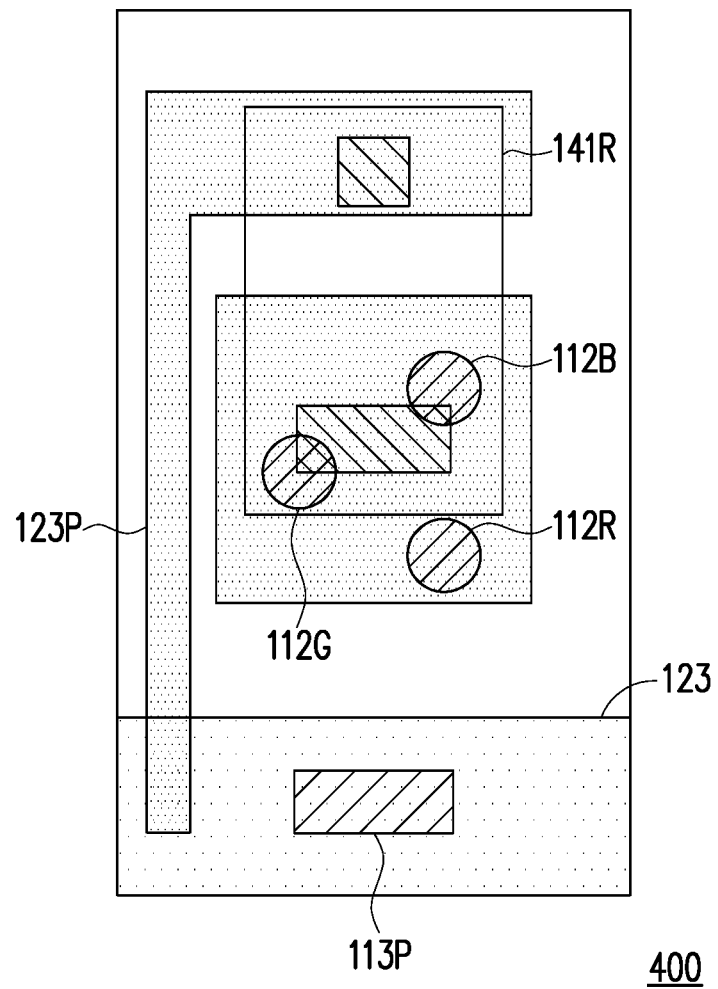
FIG. 4B to FIG. 4D are partial schematic top views of a display panel according to the fourth embodiment of the disclosure.
Figure 4C:
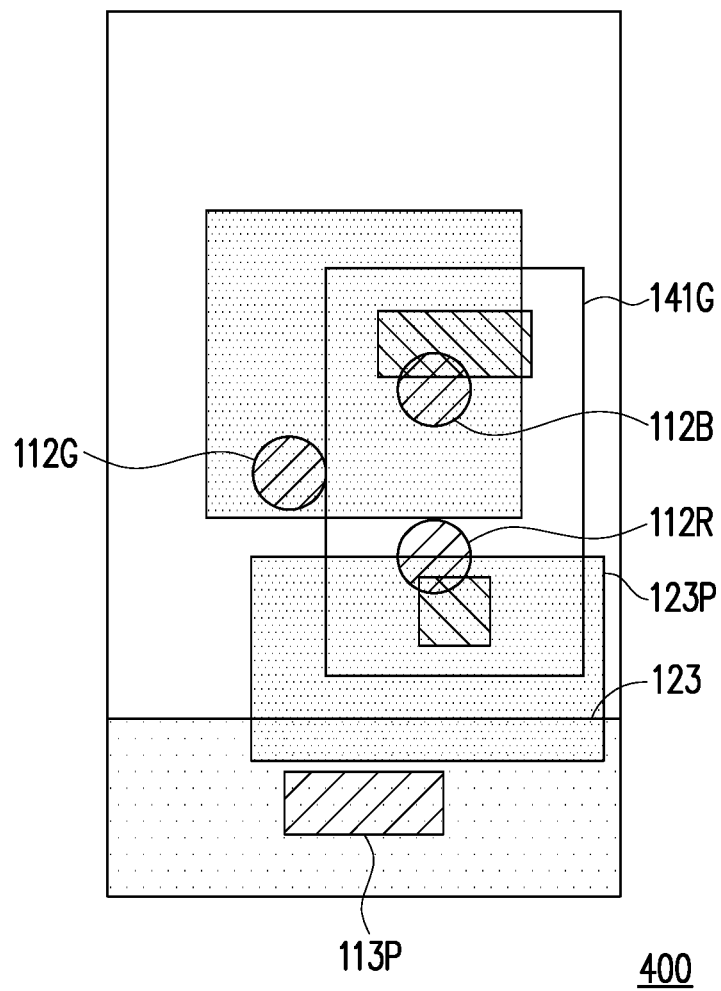
Figure 4D:
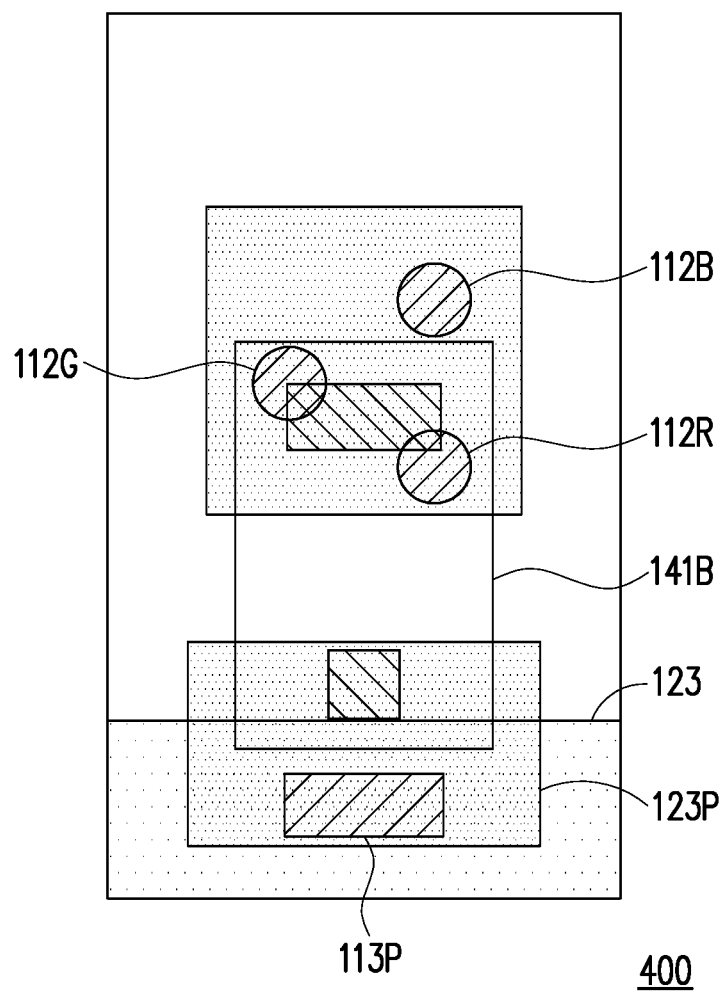

FIG. 4A is a partial schematic top view of a partial manufacturing method for a display panel according to the fourth embodiment of the disclosure. FIG. 4B to FIG. 4D are partial schematic top views of a display panel according to the fourth embodiment of the disclosure. For clarity, FIG. 4A to FIG. 4D omit some of the layers or components in the drawing. The display panel 400 of the fourth embodiment is similar to the display panel 100 of the first embodiment. Therefore, in the description or drawings of the display panel 400 of the fourth embodiment, the same or similar reference numerals represent the same or similar components, so the components described in the first embodiment will not be repeated here.

Referring to FIG. 4A, in this embodiment, one of the pixel regions PU of the array substrate 410 may include a first connection pad 112R, a second connection pad 112G, a third connection pad 112B, a first sub-pixel pad 111R, a second sub-pixel pad 111G, a third sub-pixel pad 111B, and at least one common connection pad 113. There is a first direction D6 for the connection line between the first connection pad 112R and the second connection pad 112G. There is a second direction D7 for the connection line between the second connection pad 112G and the third connection pad 112B. There is a third direction D8 for the connection line between the third connection pad 112B and the first connection pad 112R. There is a first dimension direction D4 at the smallest dimension of the first light-emitting diode 140R, the second light-emitting diode 140G, or the third light-emitting diode 140B. One of the first direction D6, the second direction D7, and the third direction D8 is substantially perpendicular to the first dimension direction D4. For example, in a top view state (such as the state depicted in FIG. 4A), the appearance contour of the first light-emitting diode 140R, the second light-emitting diode 140G, and the third light-emitting diode 140B may be substantially the same as or similar to a rectangular shape. There is a first dimension direction D4 at the width of the first light-emitting diode 140R, the second light-emitting diode 140G, or the third light-emitting diode 140B. In an embodiment, there is a second dimension direction D5 at the smallest dimension of the first light-emitting diode 140R, the second light-emitting diode 140G, or the third light-emitting diode 140B, and the second dimension direction D5 is substantially parallel to the first dimension direction D4.

In the embodiment, after performing the test step or inspection step described above, the damaged, malfunctioned or low-efficiency light-emitting diodes can be repaired accordingly, and the repairing method may be the same as or similar to the repairing method described above. Therefore, repetition will not be narrated herein. Moreover, the repairing method in the embodiment is briefly described below with examples.

Taking Repairing the First Light-Emitting Diode 140R as an Example

In this embodiment, after the test step or the inspection step is performed to the first light-emitting diode 140R disposed on the array substrate 110, if the first light-emitting diode 140R is deemed not to have the expected light emission, then another first light-emitting diode 141R may be disposed on the array substrate 110. The luminous color or brightness of the first light-emitting diode 141R may be substantially the same as or similar to the originally expected color or brightness of the first light-emitting diode 140R. The first light-emitting diode 141R completely overlaps the second connection pad 112G and the third connection pad 112B, and the first light-emitting diode 141R does not completely overlap (e.g., partially overlap or completely non-overlap) the first connection pad 112R. Then, the first connection pad 112R may be electrically connected to one end of the first light-emitting diode 141R, and the common connection pad 113P may be electrically connected to the other end of the first light-emitting diode 141R. In this way, through the same or similar driving method for the first light-emitting diode 140R, the first light-emitting diode 141R may be driven to emit light.

Taking Repairing the Second Light-Emitting Diode 140G as an Example

In this embodiment, after the test step or the inspection step is performed to the second light-emitting diode 140G disposed on the array substrate 110, if the second light-emitting diode 140G is deemed not to have the expected light emission, then another second light-emitting diode 141G may be disposed on the array substrate 110. The luminous color or brightness of the second light-emitting diode 141G may be substantially the same as or similar to the originally expected color or brightness of the second light-emitting diode 140G. The second light-emitting diode 141G completely overlaps the third connection pad 112B and the first connection pad 112R, and the second light-emitting diode 141G does not completely overlap (e.g., partially overlap or completely non-overlap) the second connection pad 112G. Then, the second connection pad 112G may be electrically connected to one end of the second light-emitting diode 140G, and the common connection pad 113P may be electrically connected to the other end of the second light-emitting diode 141G. In this way, through the same or similar driving method for the second light-emitting diode 140G, the second light-emitting diode 141G may be driven to emit light.

Taking Repairing the Third Light-Emitting Diode 140B as an Example

In this embodiment, after the test step or the inspection step is performed to the third light-emitting diode 140B disposed on the array substrate 110, if the third light-emitting diode 140B is deemed not to have the expected light emission, then another third light-emitting diode 141B may be disposed on the array substrate 110. The luminous color or brightness of the third light-emitting diode 141B may be substantially the same as or similar to the originally expected color or brightness of the third light-emitting diode 140B. The third light-emitting diode 141B completely overlaps the first connection pad 112R and the second connection pad 112G, and the third light-emitting diode 141B does not completely overlap (e.g., partially overlap or completely non-overlap) the third connection pad 112B. Then, the third connection pad 112B may be electrically connected to one end of the third light-emitting diode 141B, and the common connection pad 113P may be electrically connected to the other end of the third light-emitting diode 141B. In this way, through the same or similar driving method for the third light-emitting diode 140B, the third light-emitting diode 141B may be driven to emit light.

Through the layout design, configuration method or repair method described above, the damaged, malfunctioned or low-efficiency light-emitting diodes can be repaired and thus the display panel 400 can have a better display quality.

Figure 5A:
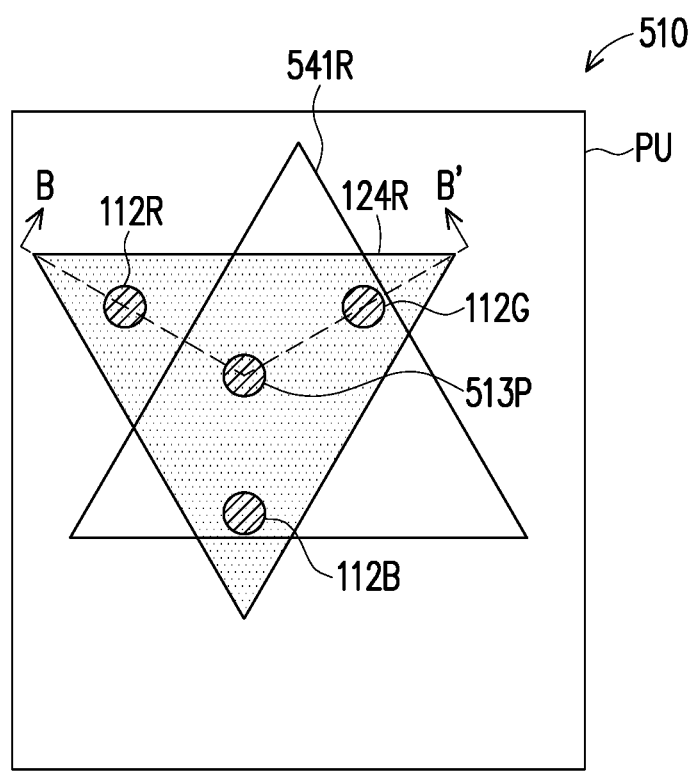
FIG. 5A to FIG. 5C are partial schematic top views of a display panel according to the fifth embodiment of the disclosure.
Figure 5B:
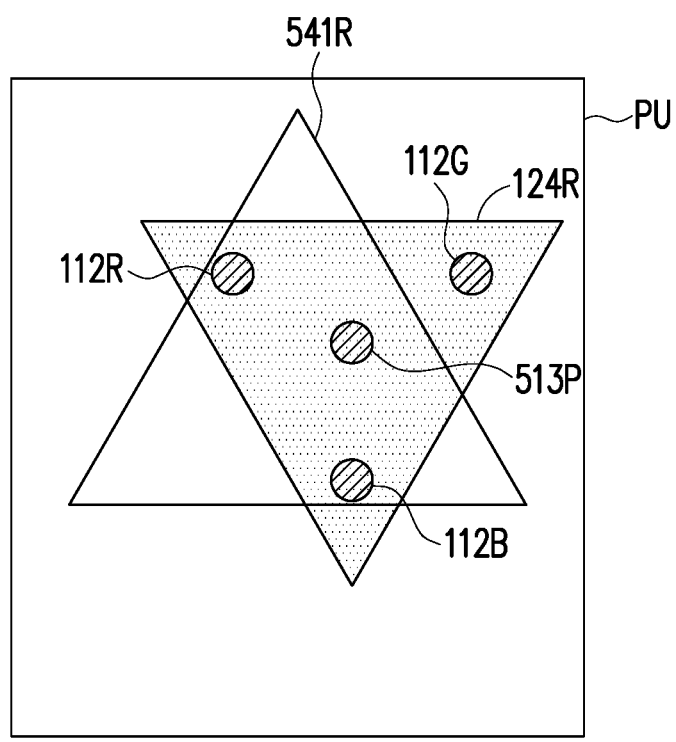
Figure 5C:
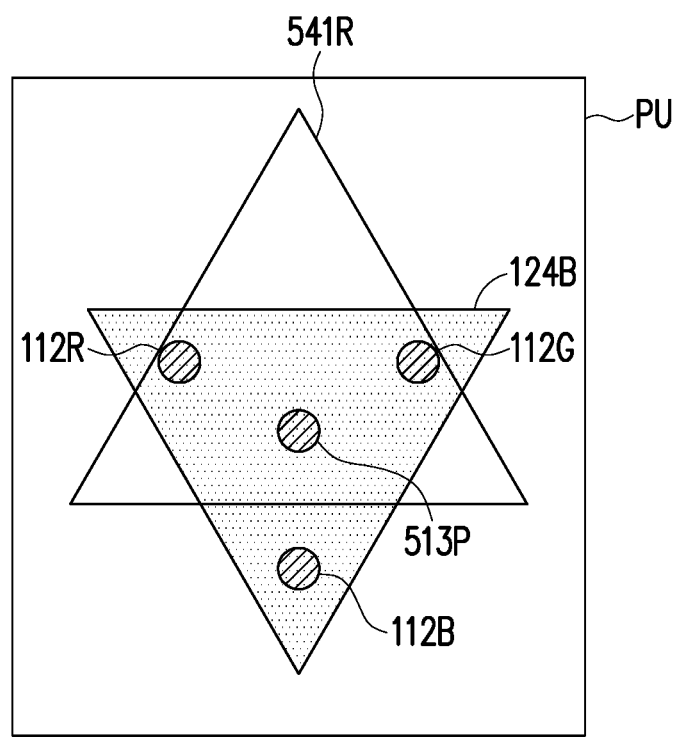
Figure 5D:
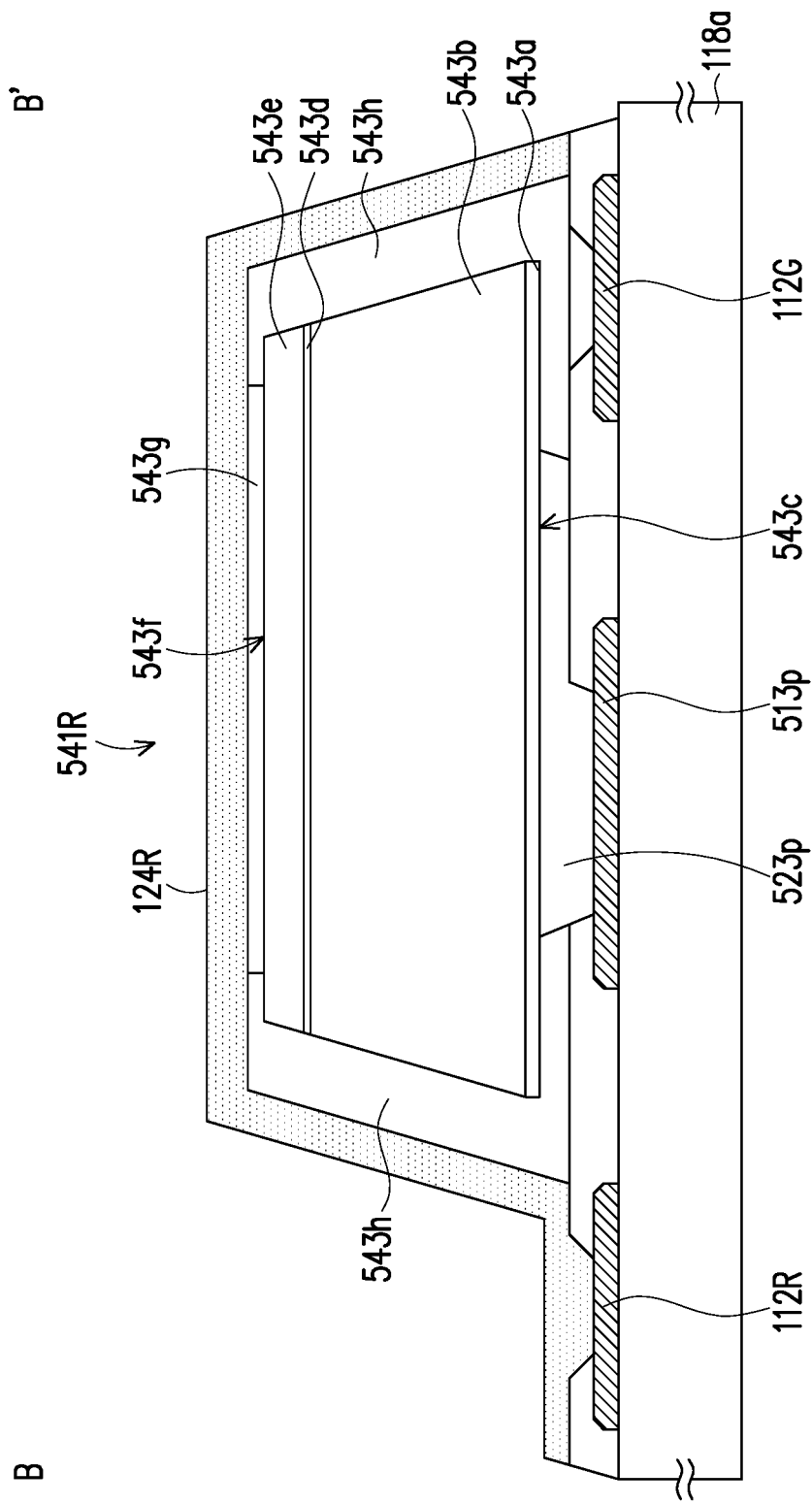
FIG. 5D is a partial cross-sectional view of a display panel according to the fifth embodiment of the disclosure.

FIG. 5A to FIG. 5C are partial schematic top views of a display panel according to the fifth embodiment of the disclosure. FIG. 5D is a partial cross-sectional view of a display panel according to the fifth embodiment of the disclosure. For example, FIG. 5D may be a schematic cross-sectional view of FIG. 5A taken along line B-B'. For clarity, FIG. 5A to FIG. 5D omit some of the layers or components in the drawing. The display panel 500 of the fifth embodiment is similar to the display panel 100 of the first embodiment. Therefore, in the description or drawings of the display panel 500 of the fifth embodiment, the same or similar reference numerals represent the same or similar components, so the components described in the first embodiment will not be repeated here.

In this embodiment, one of the pixel regions PU of the array substrate 510 may include a first connection pad 112R, a second connection pad 112G, a third connection pad 112B, a first sub-pixel pad 111R, a second sub-pixel pad 111G, a third sub-pixel pad 111B, and at least one common connection pad 113. The common connection pad 113 may include the common connection pad 513P. The common connection pad 513P may be configured corresponding to the first connection pad 112R, the second connection pad 112G, and the third connection pad 112B. In a top view state (such as the state shown in FIG. 5A), the common connection pad 113 may be located within a contour of the first connection pad 112R, the second connection pad 112G, and the third connection pad 112B connected to each other.

In the embodiment, after performing the test step or inspection step described above, the damaged, malfunctioned or low-efficiency light-emitting diodes can be repaired accordingly, and the repairing method may be the same as or similar to the repairing method described above. Therefore, repetition will not be narrated herein. Moreover, the repairing method in the embodiment is briefly described below with examples.

Taking Repairing the First Light-Emitting Diode 140R as an Example

In this embodiment, after the test step or the inspection step is performed to the first light-emitting diode 140R disposed on the array substrate 110, if the first light-emitting diode 140R is deemed not to have the expected light emission, then another first light-emitting diode 541R may be disposed on the array substrate 110. The luminous color or brightness of the first light-emitting diode 541R may be substantially the same as or similar to the originally expected color or brightness of the first light-emitting diode 140R. The first light-emitting diode 541R completely overlaps the second connection pad 112G, the third connection pad 112B and the common connection pad 513P, and the first light-emitting diode 541R does not completely overlap (e.g., partially overlap or completely non-overlap) the first connection pad 112R. Then, the first connection pad 112R may be electrically connected to one end of the first light-emitting diode 541R, and the common connection pad 513P may be electrically connected to the other end of the first light-emitting diode 541R. In this way, through the same or similar driving method for the first light-emitting diode 140R, the first light-emitting diode 541R may be driven to emit light.

In this embodiment, the first light-emitting diode 541R may be a vertical type light-emitting diode. For example, the first light-emitting diode 541R may include a first electrode 543a, a first type semiconductor layer 543b, a light-emitting region 543d, a second type semiconductor layer 543e, a second electrode 543g, and an insulating layer 543h. The light-emitting region 543d is located between the first type semiconductor layer 543b and the second type semiconductor layer 543e. The first type semiconductor layer 543b has a first wire connection surface 543c. The second type semiconductor layer 543e has a second wire connection surface 543f. The first wire connection surface 543c of the first type semiconductor layer 543b and the second wire connection surface 543f of the second type semiconductor layer 543e substantially face opposite directions. The first electrode 543a is located on the first wire connection surface 543c of the first type semiconductor layer 543b and is electrically connected to the first type semiconductor layer 543b. The second electrode 543g is located on the second wire connection surface 543f of the second type semiconductor layer 543e and is electrically connected to the second type semiconductor layer 543e. The insulating layer 543h covers the first electrode 543a, the first type semiconductor layer 543b, the light-emitting region 543d, the second type semiconductor layer 543e, and the second electrode 543g, and the insulating layer 543h can expose a part of the first electrode 543a and a part of the second electrode 543g. By adjusting the material, composition, structure or doping concentration of the light-emitting region 543d, the first light-emitting diode 541R can have a corresponding luminous color.

In this embodiment, the connection line 124R may cover the first light-emitting diode 541R, such that the first connection pad 112R is connected to one end of the first light-emitting diode 541R through the connection line 124R, but the disclosure is not limited thereto.

In this embodiment, the connection line 523P may be located between the first light-emitting diode 541R and the common connection pad 513P, such that the common connection pad 513P is connected with the other end of the first light-emitting diode 541R through the connection line 523P. In an embodiment, the material of the connection line 523P may include solder.

In this embodiment, in a top view state (e.g., similar to the state depicted in FIG. 1F), the contour of the first light-emitting diode 140R, the second light-emitting diode 140G, and the third light-emitting diode 140B connected to each other may be similar to the contour of the first light-emitting diode 541R, the second light-emitting diode 140G, and the third light-emitting diode 140B connected to each other. That is to say, within the range of the pixel region PU, after the first light-emitting diode 140R is repaired, replaced, or substituted with the first light-emitting diode 541R, the visual difference between them may not be too obvious, so that the display panel can have a better display quality.

Taking Repairing the Second Light-Emitting Diode 140G as an Example

In this embodiment, after the test step or the inspection step is performed to the second light-emitting diode 140G disposed on the array substrate 110, if the second light-emitting diode 140G is deemed not to have the expected light emission, then another second light-emitting diode 541G may be disposed on the array substrate 110. The luminous color or brightness of the second light-emitting diode 541G may be substantially the same as or similar to the originally expected color or brightness of the second light-emitting diode 140G. The second light-emitting diode 541G completely overlaps the third connection pad 112B, the first connection pad 112R and the common connection pad 513P, and the second light-emitting diode 541G does not completely overlap (e.g., partially overlap or completely non-overlap) the second connection pad 112G. Then, the second connection pad 112G may be electrically connected to one end of the second light-emitting diode 541G, and the common connection pad 513P may be electrically connected to the other end of the second light-emitting diode 541G. In this way, through the same or similar driving method for the second light-emitting diode 140G, the second light-emitting diode 541G may be driven to emit light.

In this embodiment, the second light-emitting diode 541G may be a lateral type light-emitting diode similar to the first light-emitting diode 541R. The difference is that the material, composition, structure or doping concentration of the light-emitting region of the second light-emitting diode 541G is different from the material, composition, structure or doping concentration of the light-emitting region of the first light-emitting diode 541R. In this way, the second light-emitting diode 541G can have a different luminous color than the first light-emitting diode 541R.

In this embodiment, the connection line 124G may cover the second light-emitting diode 541G, such that the second connection pad 112G is connected to one end of the second light-emitting diode 541G through the connection line 124R, but the disclosure is not limited thereto.

In this embodiment, the connection line (e.g., the connection line that is similar to the connection line 523P) may be located between the second light-emitting diode 541G and the common connection pad 513P, such that the common connection pad 513P is connected with the other end of the second light-emitting diode 541G through the connection line 523P.

In this embodiment, in a top view state (e.g., similar to the state depicted in FIG. 1F), the contour of the first light-emitting diode 140R, the second light-emitting diode 140G, and the third light-emitting diode 140B connected to each other may be similar to the contour of the first light-emitting diode 140R, the second light-emitting diode 541G, and the third light-emitting diode 140B connected to each other. That is to say, within the range of the pixel region PU, after the second light-emitting diode 140G is repaired, replaced, or substituted with the second light-emitting diode 541G, the visual difference between them may not be too obvious, so that the display panel can have a better display quality.

Taking Repairing the Third Light-Emitting Diode 140B as an Example

In this embodiment, after the test step or the inspection step is performed to the third light-emitting diode 140B disposed on the array substrate 110, if the third light-emitting diode 140B is deemed not to have the expected light emission, then another third light-emitting diode 541B may be disposed on the array substrate 110. The luminous color or brightness of the third light-emitting diode 541B may be substantially the same as or similar to the originally expected color or brightness of the third light-emitting diode 140B. The third light-emitting diode 541B completely overlaps the first connection pad 112R, the second connection pad 112G and the common connection pad 513P, and the third light-emitting diode 541B does not completely overlap (e.g., partially overlap or completely non-overlap) the third connection pad 112B. Then, the third connection pad 112B may be electrically connected to one end of the third light-emitting diode 541B, and the common connection pad 513P may be electrically connected to the other end of the third light-emitting diode 541B. In this way, through the same or similar driving method for the third light-emitting diode 140B, the third light-emitting diode 541B may be driven to emit light.

In this embodiment, the third light-emitting diode 541B may be a vertical type light-emitting diode similar to the first light-emitting diode 541R or the second light-emitting diode 541G. The difference is that the material, composition, structure or doping concentration of the light-emitting region of the third light-emitting diode 541B is different from the material, composition, structure or doping concentration of the light-emitting region of the first light-emitting diode 541R or the second light-emitting diode 541G. In this way, the third light-emitting diode 541B can have a different luminous color than the first light-emitting diode 541R or the second light-emitting diode 541G.

In this embodiment, the connection line 124B may cover the third light-emitting diode 541B, such that the third connection pad 112B is connected to one end of the third light-emitting diode 541B through the connection line 124B, but the disclosure is not limited thereto.

In this embodiment, the connection line (e.g., the connection line that is similar to the connection line 523P) may be located between the third light-emitting diode 541B and the common connection pad 513P, such that the common connection pad 513P is connected with the other end of the third light-emitting diode 541B through the connection line.

In this embodiment, in a top view state (e.g., similar to the state depicted in FIG. 1F), the contour of the first light-emitting diode 140R, the second light-emitting diode 140G, and the third light-emitting diode 140B connected to each other may be similar to the contour of the first light-emitting diode 140R, the second light-emitting diode 140G, and the third light-emitting diode 541B connected to each other. That is to say, within the range of the pixel region PU, after the third light-emitting diode 140B is repaired, replaced, or substituted with the third light-emitting diode 541B, the visual difference between them may not be too obvious, so that the display panel 500 can have a better display quality.

Through the layout design, configuration method or repair method described above, the damaged, malfunctioned or low-efficiency light-emitting diodes can be repaired and thus the display panel 500 can have a better display quality.

Figure 6:
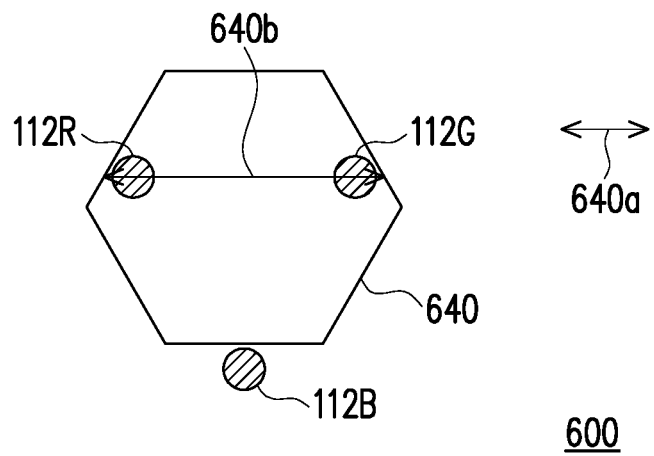
FIG. 6 is a partial schematic top view of a display panel according to the sixth embodiment of the disclosure.

FIG. 6 is a partial schematic top view of a display panel according to the sixth embodiment of the disclosure. For clarity, FIG. 6 omits some of the layers or components in the drawing. The display panel 600 of the sixth embodiment is similar to the display panel 100 of the first embodiment. Therefore, in the description or drawings of the display panel 600 of the sixth embodiment, the same or similar reference numerals represent the same or similar components, so the components described in the first embodiment will not be repeated here.

In this embodiment, in a top view state (such as the state depicted in FIG. 6), the appearance contour of the light-emitting diode 640 may be substantially the same as or similar to a hexagonal shape. Moreover, in one direction 640a, a dimension 640b of the light-emitting diode 640 is greater than the first distance L1, the second distance L2, and the third distance L3. That is, in the direction 640a, the maximum dimension of the light-emitting diode 640 may be greater than the first distance L1, the second distance L2, and the third distance L3. In an embodiment, with the arrangement described above, when configuring the light-emitting diode 640, it is easier for the light-emitting diode 640 to completely overlap one of the first connection pad 112R, the second connection pad 112G, or the third connection pad 112B without completely overlapping the other one of the first connection pad 112R, the second connection pad 112G, or the third connection pad 112B.

The configuration of the light-emitting diode 640 may be the same as or similar to the first light-emitting diode 141R or 541R, the second light-emitting diode 141G or 541G, or the third light-emitting diode 141B or 541B. For example, the light-emitting diode 640 may completely overlap the first connection pad 112R and the third connection pad 112B without completely overlapping the second connection pad 112G.

Figure 7:
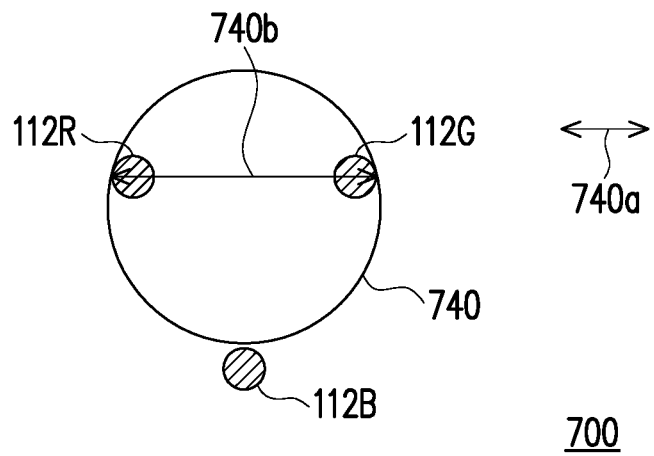
FIG. 7 is a partial schematic top view of a display panel according to the seventh embodiment of the disclosure.

FIG. 7 is a partial schematic top view of a display panel according to the seventh embodiment of the disclosure. For clarity, FIG. 7 omits some of the layers or components in the drawing. The display panel 700 of the seventh embodiment is similar to the display panel 100 of the first embodiment. Therefore, in the description or drawings of the display panel 700 of the seventh embodiment, the same or similar reference numerals represent the same or similar components, so the components described in the first embodiment will not be repeated here.

In this embodiment, in a top view state (such as the state depicted in FIG. 7), the appearance contour of the light-emitting diode 740 may be substantially the same as or similar to a circle, an oval or other arc shapes. Moreover, in one direction 740a, a dimension 740b of the light-emitting diode 740 is greater than the first distance L1, the second distance L2, and the third distance L3. That is, in the direction 740a, the maximum dimension of the light-emitting diode 740 may be greater than the first distance L1, the second distance L2, and the third distance L3. In an embodiment, with the arrangement described above, when configuring the light-emitting diode 740, it is easier for the light-emitting diode 740 to completely overlap one of the first connection pad 112R, the second connection pad 112G, or the third connection pad 112B without completely overlapping the other one of the first connection pad 112R, the second connection pad 112G, or the third connection pad 112B.

The configuration of the light-emitting diode 740 may be the same as or similar to the first light-emitting diode 141R or 541R, the second light-emitting diode 141G or 541G, or the third light-emitting diode 141B or 541B. For example, the light-emitting diode 740 may completely overlap the first connection pad 112R and the third connection pad 112B without completely overlapping the second connection pad 112G.

Figure 8:
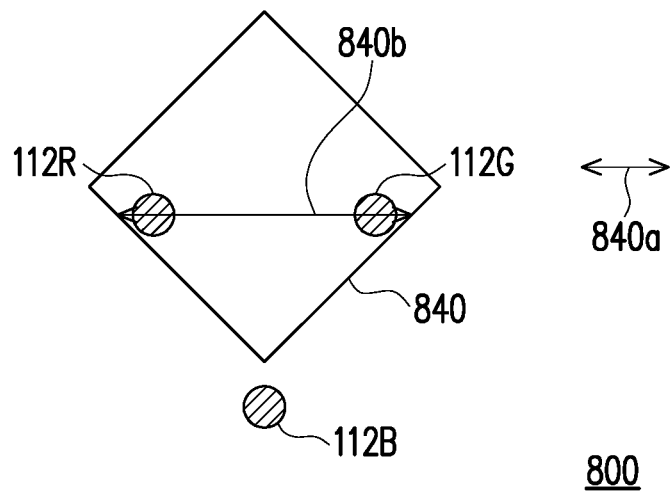
FIG. 8 is a partial schematic top view of a display panel according to the eighth embodiment of the disclosure.

FIG. 8 is a partial schematic top view of a display panel according to the eighth embodiment of the disclosure. For clarity, FIG. 8 omits some of the layers or components in the drawing. The display panel 800 of the eighth embodiment is similar to the display panel 100 of the first embodiment. Therefore, in the description or drawings of the display panel 800 of the eighth embodiment, the same or similar reference numerals represent the same or similar components, so the components described in the first embodiment will not be repeated here.

In this embodiment, in a top view state (such as the state depicted in FIG. 8), the appearance contour of the light-emitting diode 840 may be substantially the same as or similar to a diamond. Moreover, in one direction 840a, a dimension 840b of the light-emitting diode 840 is greater than the first distance L1, the second distance L2, and the third distance L3. That is, in the direction 840a, the maximum dimension of the light-emitting diode 840 may be greater than the first distance L1, the second distance L2, and the third distance L3. In an embodiment, with the arrangement described above, when configuring the light-emitting diode 840, it is easier for the light-emitting diode 840 to completely overlap one of the first connection pad 112R, the second connection pad 112G, or the third connection pad 112B without completely overlapping the other one of the first connection pad 112R, the second connection pad 112G, or the third connection pad 112B.

The configuration of the light-emitting diode 840 may be the same as or similar to the first light-emitting diode 141R or 541R, the second light-emitting diode 141G or 541G, or the third light-emitting diode 141B or 541B. For example, the light-emitting diode 840 may completely overlap the first connection pad 112R and the third connection pad 112B without completely overlapping the second connection pad 112G.

Figure 9:
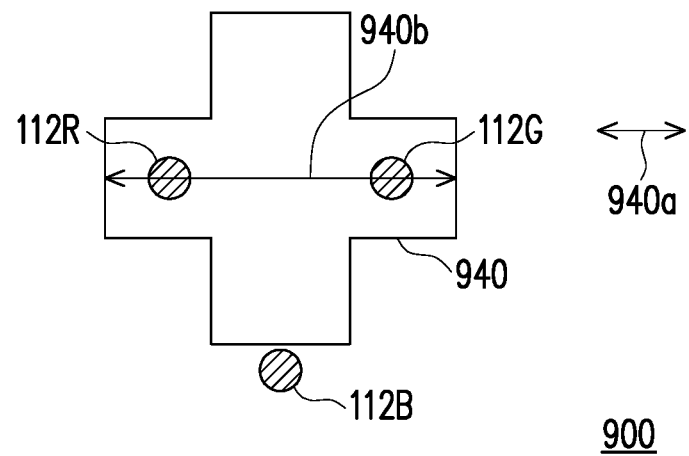
FIG. 9 is a partial schematic top view of a display panel according to the ninth embodiment of the disclosure.

FIG. 9 is a partial schematic top view of a display panel according to the ninth embodiment of the disclosure. For clarity, FIG. 9 omits some of the layers or components in the drawing. The display panel 900 of the ninth embodiment is similar to the display panel 100 of the first embodiment. Therefore, in the description or drawings of the display panel 900 of the ninth embodiment, the same or similar reference numerals represent the same or similar components, so the components described in the first embodiment will not be repeated here.

In this embodiment, in a top view state (such as the state depicted in FIG. 9), the appearance contour of the light-emitting diode 940 may be substantially the same as or similar to a cross. Moreover, in one direction 940a, a dimension 940b of the light-emitting diode 940 is greater than the first distance L1, the second distance L2, and the third distance L3. That is, in the direction 940a, the maximum dimension of the light-emitting diode 940 may be greater than the first distance L1, the second distance L2, and the third distance L3. In an embodiment, with the arrangement described above, when configuring the light-emitting diode 940, it is easier for the light-emitting diode 940 to completely overlap one of the first connection pad 112R, the second connection pad 112G, or the third connection pad 112B without completely overlapping the other one of the first connection pad 112R, the second connection pad 112G, or the third connection pad 112B.

The configuration of the light-emitting diode 940 may be the same as or similar to the first light-emitting diode 141R or 541R, the second light-emitting diode 141G or 541G, or the third light-emitting diode 141B or 541B. For example, the light-emitting diode 940 may completely overlap the first connection pad 112R and the third connection pad 112B without completely overlapping the second connection pad 112G.

Figure 10:
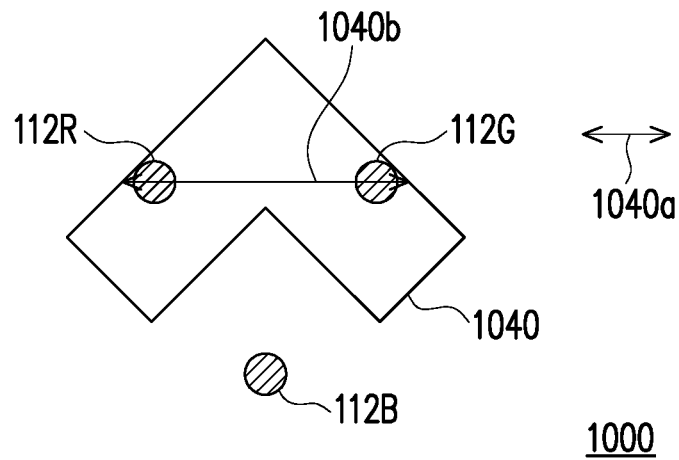
FIG. 10 is a partial schematic top view of a display panel according to the tenth embodiment of the disclosure.

FIG. 10 is a partial schematic top view of a display panel according to the tenth embodiment of the disclosure. For clarity, FIG. 10 omits some of the layers or components in the drawing. The display panel 1000 of the tenth embodiment is similar to the display panel 100 of the first embodiment. Therefore, in the description or drawings of the display panel 1000 of the tenth embodiment, the same or similar reference numerals represent the same or similar components, so the components described in the first embodiment will not be repeated here.

In this embodiment, in a top view state (such as the state depicted in FIG. 10), the appearance contour of the light-emitting diode 1040 may be substantially the same as or similar to an arrow. Moreover, in one direction 1040a, a dimension 1040b of the light-emitting diode 1040 is greater than the first distance L1, the second distance L2, and the third distance L3. That is, in the direction 1040a, the maximum dimension of the light-emitting diode 1040 may be greater than the first distance L1, the second distance L2, and the third distance L3. In an embodiment, with the arrangement described above, when configuring the light-emitting diode 1040, it is easier for the light-emitting diode 1040 to completely overlap one of the first connection pad 112R, the second connection pad 112G, or the third connection pad 112B without completely overlapping the other one of the first connection pad 112R, the second connection pad 112G, or the third connection pad 112B.

The configuration of the light-emitting diode 1040 may be the same as or similar to the first light-emitting diode 141R or 541R, the second light-emitting diode 141G or 541G, or the third light-emitting diode 141B or 541B. For example, the light-emitting diode 1040 may completely overlap the first connection pad 112R and the third connection pad 112B without completely overlapping the second connection pad 112G.

Figure 11:
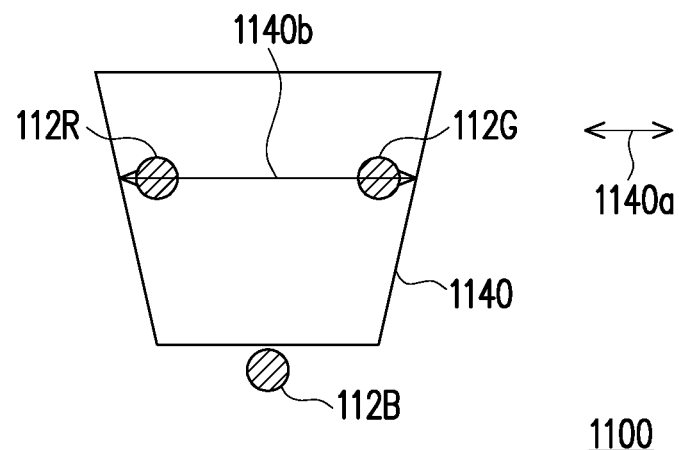
FIG. 11 is a partial schematic top view of a display panel according to the eleventh embodiment of the disclosure.
Figure 12A:
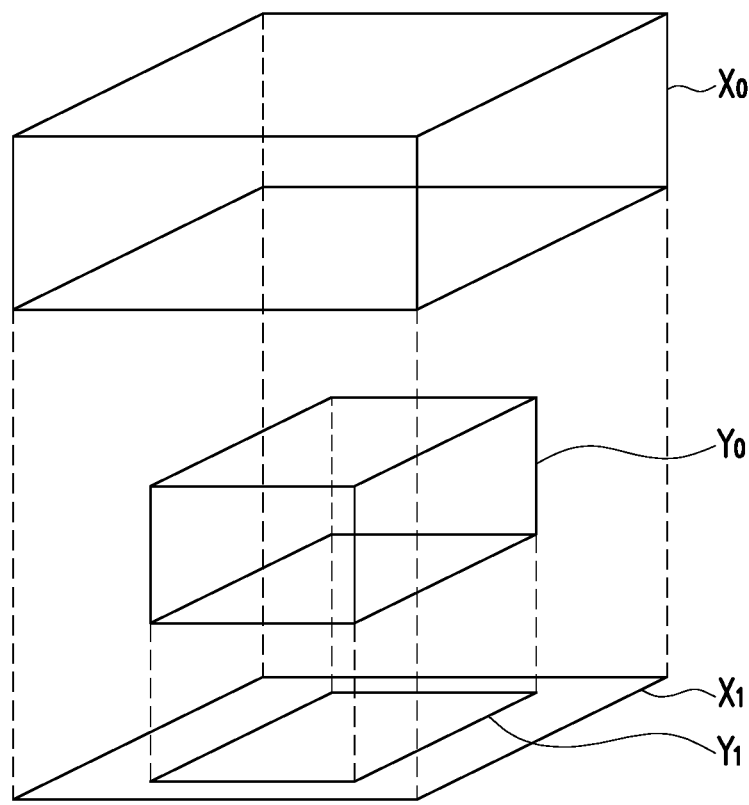
FIG. 12A is a perspective view of an object completely overlapping another object.
Figure 12B:
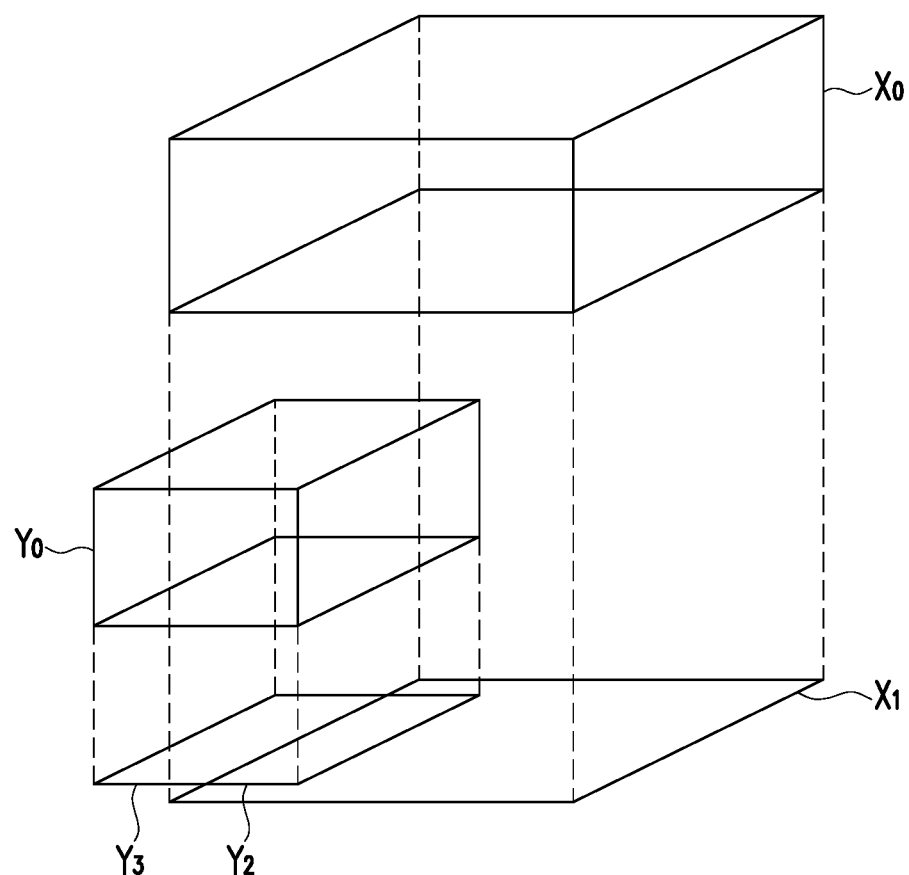
FIG. 12B is a perspective view of an object partially overlapping another object.
Figure 12C:
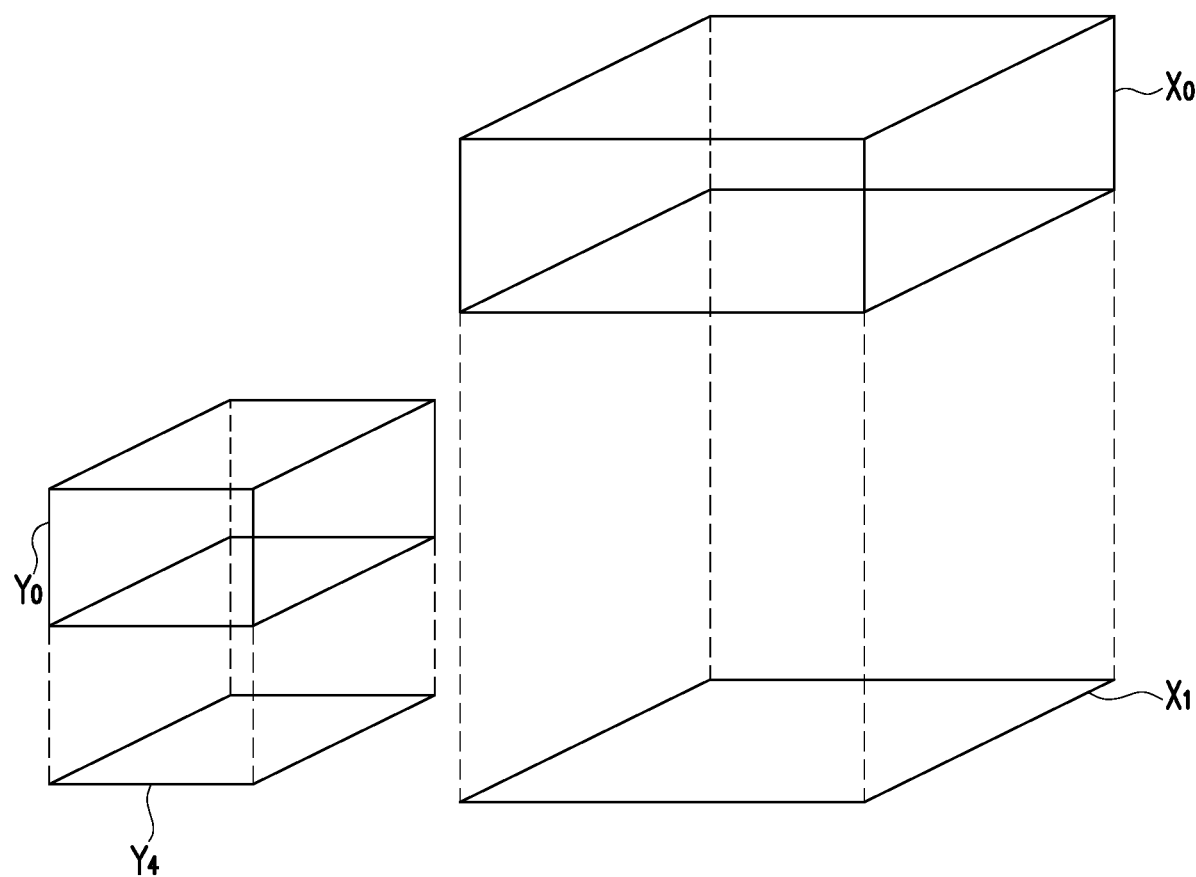
FIG. 12C is a perspective view of an object completely non-overlapping another object.

FIG. 11 is a partial schematic top view of a display panel according to the eleventh embodiment of the disclosure. For clarity, FIG. 11 omits some of the layers or components in the drawing. The display panel 1100 of the eleventh embodiment is similar to the display panel 100 of the first embodiment. Therefore, in the description or drawings of the display panel 1100 of the eleventh embodiment, the same or similar reference numerals represent the same or similar components, so the components described in the first embodiment will not be repeated here.

In this embodiment, in a top view state (such as the state depicted in FIG. 11), the appearance contour of the light-emitting diode 1140 may be substantially the same as or similar to a trapezoid. Moreover, in one direction 1140a, a dimension 1140b of the light-emitting diode 1140 is greater than the first distance L1, the second distance L2, and the third distance L3. That is, in the direction 1140a, the maximum dimension of the light-emitting diode 1140 may be greater than the first distance L1, the second distance L2, and the third distance L3. In an embodiment, with the arrangement described above, when configuring the light-emitting diode 1140, it is easier for the light-emitting diode 1140 to completely overlap one of the first connection pad 112R, the second connection pad 112G, or the third connection pad 112B without completely overlapping the other one of the first connection pad 112R, the second connection pad 112G, or the third connection pad 112B.

The configuration of the light-emitting diode 1140 may be the same as or similar to the first light-emitting diode 141R or 541R, the second light-emitting diode 141G or 541G, or the third light-emitting diode 141B or 541B. For example, the light-emitting diode 1140 may completely overlap the first connection pad 112R and the third connection pad 112B without completely overlapping the second connection pad 112G.

In the foregoing embodiments, unless otherwise specified or limited, the dimension of the light-emitting diode (e.g., at least one of the first light-emitting diode 140R, the second light-emitting diode 140G, or the third light-emitting diode 140B) is, for example, smaller than 100 microns, preferably smaller than 50 microns, but larger than 0 microns. The micro light-emitting element may be, for example, an organic light-emitting element or an inorganic light-emitting element, preferably, the micro light-emitting element may be an inorganic light-emitting element, but is not limited thereto. The structure of the micro light-emitting element may be a P—N diode, a P-I-N diode, or other suitable structure. The type of the micro light-emitting element may be a vertical micro light-emitting element, a lateral micro light-emitting element, or a flip chip micro light-emitting element. The micro light-emitting element may be an organic material (for example: organic polymer light-emitting material, organic small molecule light-emitting material, organic complex light-emitting material, or other suitable material, or a combination of the foregoing materials), an inorganic material (for example: perovskite material, rare earth ion luminescent material, rare earth fluorescent material, semiconductor luminescent material, or other suitable materials, or a combination of the foregoing materials), or other suitable materials, or a combination of the foregoing materials.

In the foregoing embodiments, the conductive layer may be a single-layer or multi-layer structure. If the conductive layer has a multilayer structure, the multilayer structure may not be provided with an insulating material.

In the foregoing embodiments, the insulating layer may be a single-layer or multi-layer structure. If the insulating layer has a multilayer structure, the multilayer structure may not be provided with a conductive material.

In the foregoing embodiments, the terms "first", "second", and "third" can be used to describe different elements, but these elements should not be limited by these terms. These terms are only used to distinguish one element from another.

Taking FIG. 1E, FIG. 1F, and FIG. 1G as examples, the display panel 100 includes an array substrate 110. The array substrate 110 has a second connection pad 112G (which may be referred to as: a first connection pad), a third connection pad 112B (which may be referred to as: a second connection pad), and a first connection pad 112R (which may be referred to as: a third connection pad). The second connection pad 112G (which may be referred to as: a first connection pad) is electrically connected to the second driving unit 130G (which may be referred to as: a first driving unit). The third connection pad 112B (which may be referred to as: a second connection pad) is electrically connected to the third driving unit 130B (which may be referred to as: a second driving unit). The first connection pad 112R (which may be referred to as: a third connection pad) is electrically connected to the first driving unit 130R (which may be referred to as: a third driving unit). The second light-emitting diode 141G (which may be referred to as: the first light-emitting diode) completely overlaps and is physically isolated from the third connection pad 112B or the first connection pad 112R (at least one of which can be referred to as: the second connection pad). The second light-emitting diode 141G (which may be referred to as: the first light-emitting diode) does not completely overlap and is electrically connected to the second connection pad 112G (which may be referred to as: the first connection pad).

Taking FIG. 1E, FIG. 1F, and FIG. 1H as examples, the display panel 100 includes an array substrate 110. The array substrate 110 has a first connection pad 112R (which may be referred to as: a first connection pad), a second connection pad 112G (which may be referred to as: a second connection pad), and a third connection pad 112B (which may be referred to as: a third connection pad). The first connection pad 112R (which may be referred to as: a first connection pad) is electrically connected to the first driving unit 130R (which may be referred to as: a first driving unit). The second connection pad 112G (which may be referred to as: a second connection pad) is electrically connected to the second driving unit 130G (which may be referred to as: a second driving unit). The third connection pad 112B (which may be referred to as: a third connection pad) is electrically connected to the third driving unit 130B (which may be referred to as: a third driving unit). The first light-emitting diode 141R (which may be referred to as: the first light-emitting diode) completely overlaps and is physically isolated from the second connection pad 112G or the third connection pad 112B (at least one of which may be referred to as: a second connection pad). The first light-emitting diode 141R (which may be referred to as: first light-emitting diode) does not completely overlap and is electrically connected to the first connection pad 112R (which may be referred to as: first connection pad).

Taking FIG. 1E, FIG. 1F, and FIG. 1I as examples, the display panel 100 includes an array substrate 110. The array substrate 110 has a third connection pad 112B (which may be referred to as: a first connection pad), a first connection pad 112R (which may be referred to as: a second connection pad), and a second connection pad 112G (which may be referred to as: a third connection pad). The third connection pad 112B (which may be referred to as: a first connection pad) is electrically connected to the third driving unit 130B (which may be referred to as: a first driving unit). The first connection pad 112R (which may be referred to as: a second connection pad) is electrically connected to the first driving unit 130R (which may be referred to as: a second driving unit). The second connection pad 112G (which may be referred to as: a third connection pad) is electrically connected to the second driving unit 130G (which may be referred to as: a third driving unit). The third light-emitting diode 141B (which may be referred to as: the first light-emitting diode) completely overlaps and is physically isolated from the first connection pad 112R or the second connection pad 112G (at least one of which may be referred to as: the second connection pad). The third light-emitting diode 141B (which may be referred to as: first light-emitting diode) does not completely overlap and is electrically connected to the third connection pad 112B (which may be referred to as: first connection pad).

In the foregoing embodiment, the range defined by "completely overlap" is as follows: if the object X0 completely overlaps the object Y0, it means that the vertical projection Y1 of the object Y0 is completely within or coincides with the vertical projection X1 of the object X0.

Taking FIG. 1G as an example, the first light-emitting diode 140R completely overlaps the second connection pad 112G, which means that the vertical projection of the second connection pad 112G on the surface of the substrate 118a is completely within or coincides with the vertical projection of the first light-emitting diode 140R on the surface of the substrate 118a. Taking FIG. 1G as an example, the first light-emitting diode 140R completely overlaps the third connection pad 112B, which means that the vertical projection of the third connection pad 112B on the surface of the substrate 118a is completely within or coincides with the vertical projection of the first light-emitting diode 140R on the surface of the substrate 118a.

In the foregoing embodiment, the range defined by "partially overlapping" is as follows: if the object X0 partially overlaps the object Y0, it means that the partial vertical projection Y2 of the object Y0 is completely within or coincides with the vertical projection X1 of the object X0, and the partial vertical projection Y3 of the object Y0 is completely outside the vertical projection X1 of the object X0.

In the foregoing embodiment, the range defined by "completely non-overlapping" is as follows: if the object X0 completely non-overlaps the object Y0, it means that the vertical projection Y4 of the object Y0 is completely outside the vertical projection X1 of the object X0.

Taking FIG. 1G as an example, the first light-emitting diode 140R completely non-overlaps the first connection pad 112R, which means that the vertical projection of the first connection pad 112R on the surface of the substrate 118a is completely outside the vertical projection of the first light-emitting diode 140R on the surface of the substrate 118a.

In the foregoing embodiments, the range defined by "not completely overlapping" is a combination that excludes the range defined by "completely overlapping". In other words, the range defined by "not completely overlapping" and the range defined by "completely overlapping" are mutually exclusive. For example, the range defined by "not completely overlapping" includes the range defined by "partially overlapping" and the range defined by "completely non-overlapping".

In summary, through the layout design, configuration method or repair method described above, the damaged, malfunctioned or low-efficiency light-emitting diodes can be repaired and thus the display panel can have a better display quality.

What is claimed is:

1. A display panel, comprising:
    an array substrate comprising a first connection pad and a second connection pad;
    a first sub-pixel comprising a first driving unit electrically connected to the first connection pad;
    a second sub-pixel comprising a second driving unit electrically connected to the second connection pad; and
    a first light-emitting diode completely overlapping and physically isolated from the second connection pad, and not completely overlapping and electrically connected to the first connection pad.

2. The display panel according to claim 1, wherein the array substrate further comprises a third connection pad, and the display panel further comprises:
    a third sub-pixel comprising a third driving unit electrically connected to the third connection pad, wherein the first light-emitting diode completely overlaps and is physically isolated from the third connection pad.

3. The display panel according to claim 2, wherein a distance between any two of the first connection pad, the second connection pad and the third connection pad is smaller than a distance between any two of the first sub-pixel, the second sub-pixel and the third sub-pixel.

4. The display panel according to claim 2, wherein in a direction, the maximum dimension of the first light-emitting diode is larger than a distance between any two of the first connection pad, the second connection pad, and the third connection pad.

5. The display panel according to claim 2, wherein the first connection pad, the second connection pad, and the third connection pad are connected as a triangle from a geometric center in a vertical projection direction of the array substrate.

6. The display panel according to claim 1, further comprising:
    a connection line covering the first light-emitting diode and is electrically connected to the first light-emitting diode and the first connection pad.

7. The display panel according to claim 1, wherein the array substrate further comprises a third connection pad, and the display panel further comprises:
    a third sub-pixel, comprising a third driving unit electrically connected to the third connection pad, wherein the first light-emitting diode completely non-overlaps and is physically isolated from the third connection pad; and
    a third light-emitting diode completely non-overlapping and physically isolated from the first connection pad, and not completely overlapping and electrically connected to the third connection pad.

8. The display panel according to claim 1, wherein:
    the array substrate further comprises a common connection pad;
    the first light-emitting diode comprising a vertical type light-emitting diode; and
    the vertical type light-emitting diode overlapping and electrically connected to the common connection pad.

9. The display panel according to claim 1, wherein the array substrate further comprises a fourth connection pad and a fifth connection pad, and the display panel further comprises:
    a fourth sub-pixel comprising a fourth driving unit electrically connected to the fourth connection pad;
    a fifth sub-pixel comprising a fifth driving unit electrically connected to the fifth connection pad; and
    a second light-emitting diode, completely overlapping and physically isolated from the fifth connection pad, and not completely overlapping and electrically connected to the fourth connection pad, wherein a luminous color of the first light-emitting diode is different from a luminous color of the second light-emitting diode.

* * * * *